(12) United States Patent
Jeon et al.

(10) Patent No.: US 12,532,592 B2
(45) Date of Patent: Jan. 20, 2026

(54) DISPLAY DEVICE AND METHOD OF MANUFACTURING THE DISPLAY DEVICE

(71) Applicant: Samsung Display Co., LTD., Yongin-si (KR)

(72) Inventors: Hyung Il Jeon, Yongin-si (KR); Min Woo Kim, Yongin-si (KR); Sung Kook Park, Yongin-si (KR); Ki Seong Seo, Yongin-si (KR); Dae Ho Song, Yongin-si (KR); Jin Woo Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 621 days.

(21) Appl. No.: 17/889,819

(22) Filed: Aug. 17, 2022

(65) Prior Publication Data

US 2023/0122324 A1 Apr. 20, 2023

(30) Foreign Application Priority Data

Oct. 14, 2021 (KR) ........................ 10-2021-0136934

(51) Int. Cl.
*H10H 29/14* (2025.01)
*H10H 20/01* (2025.01)
*H10H 20/813* (2025.01)

(52) U.S. Cl.
CPC ......... *H10H 29/142* (2025.01); *H10H 20/017* (2025.01); *H10H 20/8132* (2025.01); *Y10S 977/774* (2013.01)

(58) Field of Classification Search
CPC ........ H10H 20/813–8133; H10H 20/811–812; H10H 20/84; H10H 20/841; H10H 20/852; H10H 20/853; H10H 20/854; H10H 20/0361; H10H 20/0363; H10H 20/851–8516; H10H 20/017; H10H 29/034; H10H 29/0362; H10H 29/842; H10H 29/8421; H10H 29/853–854; H10H 29/0361–0365; H10H 29/851–8516; H10H 29/855–857; H10K 59/87–874; H10K 59/877; H10K 59/878; H10K 59/879; H10K 59/35; H10K 59/38
See application file for complete search history.

(56) References Cited

U.S. PATENT DOCUMENTS 10,475,970 B2 11/2019 Chen et al.
10,964,674 B2 3/2021 Bang et al.
11,393,880 B2 7/2022 Jang et al.
(Continued)

FOREIGN PATENT DOCUMENTS

JP 2002-189120 7/2002
KR 10-2019-0094836 8/2019
KR 10-2020-0054423 5/2020

*Primary Examiner* — Zandra V Smith
*Assistant Examiner* — Douglas Yap
(74) *Attorney, Agent, or Firm* — CANTOR COLBURN LLP

(57) ABSTRACT

A display device includes a first pixel, a second pixel, and a third pixel, bank patterns disposed on a substrate, light-emitting elements disposed between the bank patterns, color conversion layers disposed on the light-emitting elements between the bank patterns, and protective layers disposed on the color conversion layers, wherein the protective layers in the first pixel, the second pixel, and the third pixel have different thicknesses.

10 Claims, 34 Drawing Sheets

(56) References Cited

U.S. PATENT DOCUMENTS

| | | | |
|---|---|---|---|
| 2017/0092820 A1* | 3/2017 | Kim | H10H 20/825 |
| 2018/0350871 A1* | 12/2018 | Lee | H10H 20/8514 |
| 2020/0013766 A1* | 1/2020 | Kim | H01L 25/167 |
| 2020/0144444 A1* | 5/2020 | Kim | H10H 20/813 |
| 2022/0199695 A1* | 6/2022 | Takiguchi | G02B 5/20 |
| 2023/0269993 A1* | 8/2023 | Sekine | H05B 33/02 |
| | | | 257/40 |

* cited by examiner

DISPLAY DEVICE AND METHOD OF MANUFACTURING THE DISPLAY DEVICE

CROSS-REFERENCE TO RELATED APPLICATION(S)

This application claims priority to and benefits of Korean Patent Application No. 10-2021-0136934 under 35 U.S.C. § 119 filed in the Korean Intellectual Property Office on Oct. 14, 2021, the entire contents of which are incorporated herein by reference.

BACKGROUND

1. Technical Field

The disclosure relates to a light-emitting display device and a method of manufacturing the same.

2. Description of the Related Art

With the recent increase of interest in information display, research and development of display devices is being continuously being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure is directed to a display device allowing processability to be improved, and a method of manufacturing the same.

The objects of the disclosure are not limited to the objects described above, and other objects not described above are understood to persons having ordinary skill in the art from the following descriptions.

A display device may include a first pixel; a second pixel; a third pixel; bank patterns disposed on a substrate; light-emitting elements disposed between the bank patterns; color conversion layers disposed on the light-emitting elements between the bank patterns; and protective layers disposed on the color conversion layers, wherein the protective layers in the first pixel, the second pixel, and the third pixel have different thicknesses.

A thickness of the protective layers in the third pixel may be greater than at least one thickness of the protective layers in the first pixel and a thickness of the protective layers in the second pixel.

The thickness of the protective layers in the first pixel may be greater than the thickness of the protective layers in the second pixel.

The protective layers may include a first protective layer disposed in the third pixel and may include openings exposing the first pixel and the second pixel.

The protective layers may include a second protective layer disposed in the first pixel and the third pixel and may include an opening exposing the second pixel.

The display device may further include a first color filter disposed in the first pixel, wherein the first color filter is disposed between the color conversion layers and the second protective layer.

The protective layers may include a third protective layer disposed in the first pixel, the second pixel, and the third pixel.

The display device may include a second color filter disposed in the second pixel, wherein the second color filter is disposed between the color conversion layers and the third protective layer.

The first pixel may be a first color pixel, the second pixel may be a second color pixel, the third pixel may be a third color pixel, and the light-emitting elements may emit a third color.

The color conversion layers may include a first color conversion layer disposed in the first pixel; a second color conversion layer disposed in the second pixel; and a scattering layer disposed in the third pixel.

A method of manufacturing a display device may include forming light-emitting elements in a first pixel, a second pixel, and a third pixel; forming bank patterns at boundaries between the first pixel, the second pixel, and the third pixel; forming organic layers between the bank patterns; forming a first protective layer on the organic layers; removing the organic layers and the first protective layer in the first pixel; forming a first color conversion layer between the bank patterns of the first pixel from which the organic layers and the first protective layer in the first pixel are removed; and forming a second protective layer on the first color conversion layer in the first pixel, the first protective layer in the second pixel, and the first protective layer in the third pixel.

The organic layers in the second pixel and the organic layers in the third pixel may be overlapped by the first protective layer in the removing of the organic layers and the first protective layer in the first pixel.

The method may further include forming a first color filter on the first color conversion layer.

The second protective layer may be formed directly on the first color filter.

The method may further include removing the organic layers, the first protective layer, and the second protective layer in the second pixel.

The method may further include forming a second color conversion layer between the bank patterns of the second pixel from which the organic layer, the first protective layer, and the second protective layer are removed.

The method may further include forming a second color filter on the second color conversion layer.

The method may further include forming a third protective layer on the second protective layer in the first pixel, the second color filter in the second pixel, and the second protective layer in the third pixel.

The third protective layer may be formed directly on the second protective layer.

The organic layer may include a scatterer.

Other details of embodiments are included in the detailed description and the drawings.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
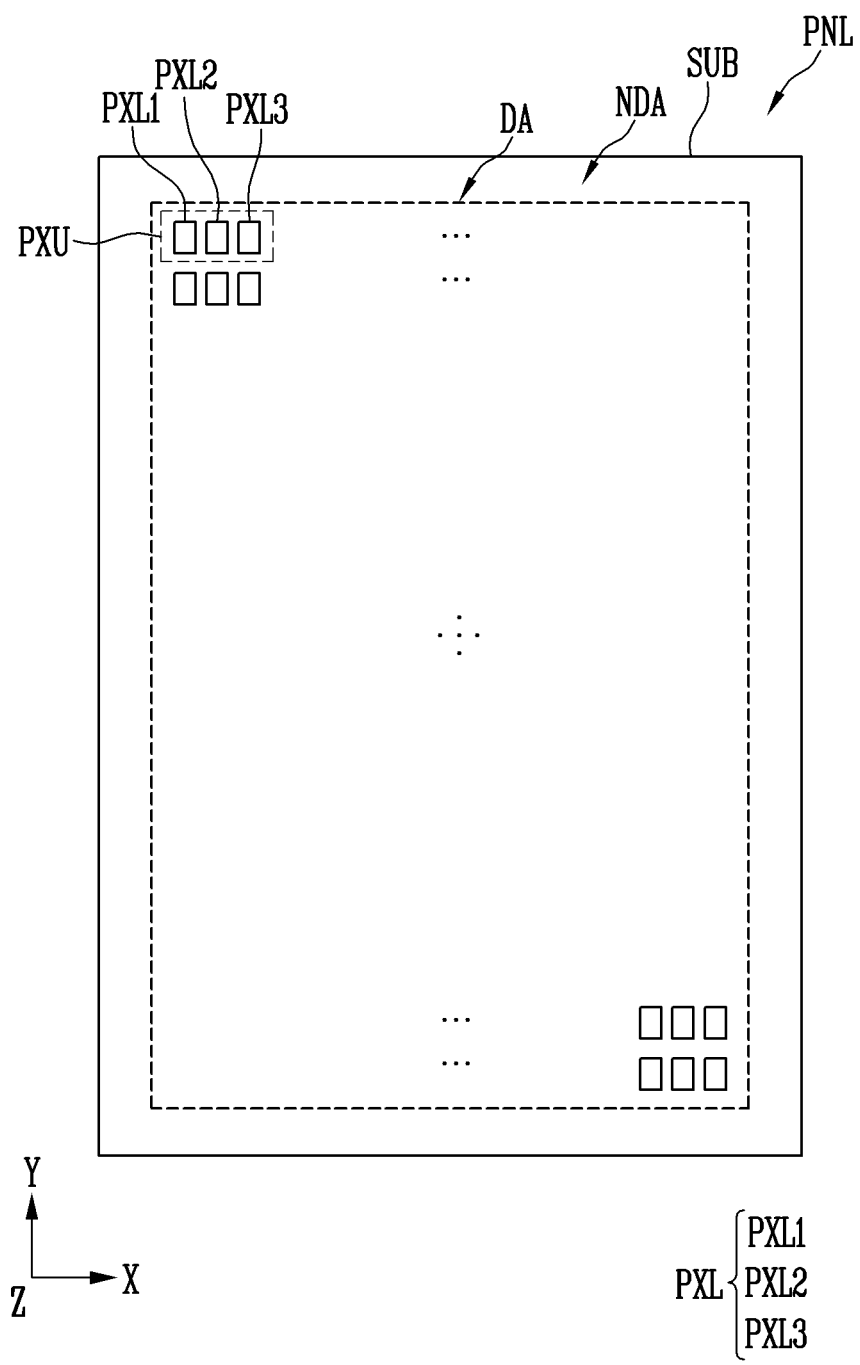
FIG. 1 is a schematic plan view illustrating a display device according to one embodiment.

The advantages and features of the disclosure and methods of achieving the advantages and features will be described more fully with reference to the accompanying drawings, in which embodiments are shown. However, the scope of the disclosure is not limited to the embodiments set forth herein and the disclosure may be realized in various forms. The embodiments are provided to make the disclosure complete and to make those having ordinary skill in the art to which the disclosure pertains completely understand the scope of the disclosure. The disclosure may also defined by the scope of the claims.

In the drawings, sizes, thicknesses, ratios, and dimensions of the elements may be exaggerated for ease of description and for clarity. Like numbers refer to like elements throughout.

The terms used in the specification are for explaining the embodiments rather than limiting the disclosure. As used herein, singular expressions, unless defined otherwise in context, include plural expressions. For example, as used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be further understood that the terms "comprises," "comprising," "includes," and/or "including," "has," "have," and/or "having," and variations thereof when used in this specification, specify the presence of stated components, steps, operations, and/or elements, but do not preclude the presence or addition of one or more other components, steps, operations, and/or elements.

The term "connection" or "coupling" may mean a physical and/or electrical connection or coupling. Furthermore, the term may mean a direct or indirect connection or coupling and an integral or non-integral connection or coupling.

It will be understood that when an element or a layer is referred to as being "on" or "above" another element or layer, it can be directly on or above another element or layer or intervening elements or layers may be present. Like reference numerals refer to like elements throughout the specification.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It should be understood that, although terms such as "first," "second," and the like may be used herein to describe various components, these components are not limited by these terms. These terms are only used to distinguish one element or component from another element or component. Therefore, a first component described below could be termed a second component without departing from the scope and spirit of the disclosure.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described in detail with reference to the accompanying drawings.

FIG. 1 is a schematic plan view illustrating a display device according to one embodiment.

FIG. 1 illustrates the display device which may use light-emitting elements as light sources, for example, a display panel PNL provided in the display device.

For convenience of description, a structure of the display panel PNL is illustrated in FIG. 1 based on a display area DA. However, according to embodiments, at least one driving circuit unit (for example, at least one of a scan driver and a data driver), lines, and pads, which are not illustrated, may be further disposed in the display panel PNL.

Referring to FIG. 1, the display panel PNL may include a substrate SUB and pixel units PXU disposed on the substrate SUB. The pixel units PXU may include first pixels PXL1, second pixels PXL2, and/or third pixels PXL3. Hereinafter, in case that at least one pixel of the first pixels PXL1, the second pixels PXL2, and the third pixels PXL3 is to be referred to or at least two pixels thereof are to be referred to, a "pixel PXL" will be referred to, or "pixels PXL" will be referred to.

The substrate SUB may constitute a base member of the display panel PNL and may be a rigid or flexible substrate or film. As an example, the substrate SUB may be provided as a rigid substrate made of glass or tempered glass or a flexible substrate (or a thin film) made of a plastic or metal material. The material and/or physical properties of the substrate SUB are not particularly limited.

The display panel PNL and the substrate SUB for forming the display panel PNL may include the display area DA for displaying an image and a non-display area NDA excluding the display area DA. Pixels PXL may be disposed in the display area DA. Various wires, pads, and/or built-in circuits connected to the pixels PXL of the display area DA may be disposed in the non-display area NDA. The pixels PXL may be regularly arranged or disposed according to a stripe or PENTILE™ arrangement structure. However, the arrangement structure of the pixels PXL is not necessarily limited thereto, and the pixels PXL may be arranged or disposed in the display area DA in various structures and/or methods.

According to embodiments, two or more types of pixels PXL emitting light having different colors may be disposed in the display area DA. As an example, the first pixels PXL1 emitting first color light, the second pixels PXL2 emitting second color light, and the third pixels PXL3 emitting third color light may be arranged or disposed in the display area DA. At least one of the first to third pixels PXL1, PXL2, and PXL3 adjacent to each other may constitute one pixel unit PXU emitting light having various colors. For example, the first to third pixels PXL1, PXL2, and PXL3 may be sub-pixels which each emit light having a color. According to embodiments, the first pixel PXL1 may be a red pixel which emits red light, the second pixel PXL2 may be a green pixel which emits green light, and the third pixel PXL3 may be a blue pixel which emits blue light.

In one embodiment, the first pixel PXL1, the second pixel PXL2, and the third pixel PXL3 may include light-emitting elements which may emit light of a same color (for example, a third color) and may include color conversion layers and/or color filter layers having different colors, which are disposed on the light-emitting elements, thereby emitting light having a first color, light having a second color, and light having the third color. In an embodiment, the first pixel PXL1, the second pixel PXL2, and the third pixel PXL3 may respectively include a first color light-emitting element, a second color light-emitting element, and a third color light-emitting element as a light source to respectively emit the light having the first color, the light having the second color, and the light having the third color. However, the color, type, and/or number of the pixels PXL constituting each pixel unit PXU are not particularly limited. For example, the color of light emitted by each pixel PXL may be variously changed.

The pixel PXL may include at least one light source driven by control signals (for example, a scan signal and a data signal) and/or power sources (for example, a first power source and a second power source). In one embodiment, the light source may include micro or nano column-shaped light-emitting elements LD having a small size ranging from a nanometer scale to a micrometer scale. However, the disclosure is not necessarily limited thereto, and, various types of light-emitting elements may be used as the light source of the pixel PXL.

In one embodiment, each pixel PXL may be formed as an active pixel. However, the type, structure, and/or driving method of the pixels PXL applicable to the display device are not particularly limited. For example, each pixel PXL having various structures and/or driving methods may be formed as a pixel of a passive or active light-emitting display device.

Figure 2:
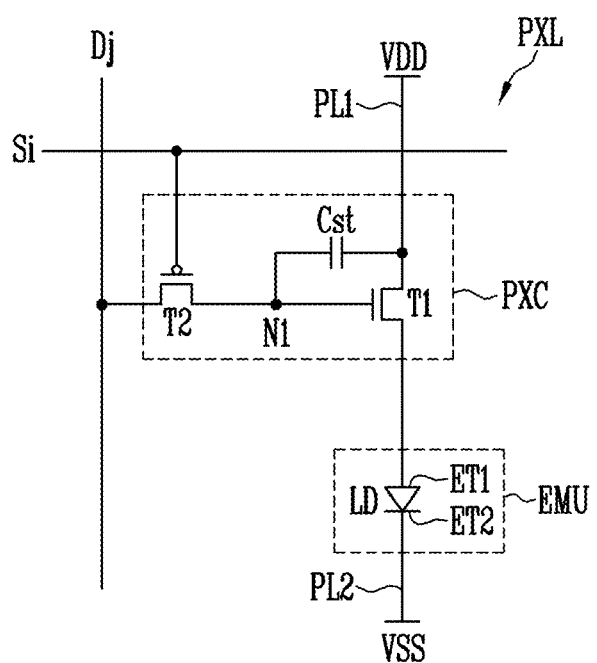
FIG. 2 is a schematic diagram of an equivalent circuit of a pixel according to one embodiment.

FIG. 2 is a schematic diagram of an equivalent circuit of a pixel according to one embodiment.

FIG. 2 illustrates an electrical connection relationship between components included in a pixel PXL applicable to an active display device. However, types of the components included in the pixel PXL are not necessarily limited thereto.

According to embodiments, the pixel PXL illustrated in FIG. 2 may be any one of the first pixel PXL1, the second pixel PXL2, and the third pixel PXL3 provided in the display panel PNL of FIG. 1. The first pixel PXL1, the second pixel PXL2, and the third pixel PXL3 may have substantially the same or similar structure.

Referring to FIG. 2, the pixel PXL may include a light-emitting unit EMU which generates light having luminance corresponding to a data signal. The pixel PXL may further include a pixel circuit PXC for driving the light-emitting unit EMU.

According to embodiments, the light-emitting unit EMU may include one or more light-emitting elements LD electrically connected between a first power line PL1 to which a voltage of a first power source VDD is applied and a second power line PL2 to which a voltage of a second power source VSS is applied. As an example, the light-emitting unit EMU may include a first electrode ET1 connected to the first power source VDD through the pixel circuit PXC and the first power line PL1, a second electrode ET2 connected to the second power source VSS through the second power line PL2, and the light-emitting element LD connected between the first electrode ET1 and the second electrode ET2. In one embodiment, the first electrode ET1 may be an anode, and the second electrode ET2 may be a cathode.

The light-emitting element LD may include one end or an end portion connected to the first power source VDD and the other end or another end portion connected to the second power source VSS. According to embodiments, one end or an end portion of the light-emitting element LD may be integral with the first electrode ET1 and connected to the first electrode ET1, and the other end or another end portion of the light-emitting element LD may be integral with the second electrode ET2 and connected to the second electrode ET2. The first power source VDD and the second power source VSS may have different potentials. A potential difference between the first power source VDD and the second power source VSS may be set to be greater than or equal to a threshold voltage of the light-emitting element LD during an emission period of the pixel PXL.

The light-emitting element LD may constitute an effective light source of the light-emitting unit EMU. The light-emitting element LD may emit light at luminance corresponding to a driving current supplied through the pixel circuit PXC. For example, during each frame period, the pixel circuit PXC may supply a driving current corresponding to a gradation value of corresponding frame data to the light-emitting unit EMU. The driving current supplied to the light-emitting unit EMU may flow in the light-emitting element LD. Accordingly, while the light-emitting element LD emits light at luminance corresponding to the driving current, the light-emitting unit EMU may emit light.

The pixel circuit PXC may be connected to a scan line Si and a data line Dj of the pixel PXL. As an example, in case that the pixel PXL is disposed in an $i^{th}$ row and a $j^{th}$ column of a display area DA (wherein i is a natural number and j is a natural number), the pixel circuit PXC of the pixel PXL may be connected to an $i^{th}$ scan line Si and a $i^{th}$ data line Dj of the display area DA. According to embodiments, the pixel circuit PXC may include first and second transistors T1 and T2 and a storage capacitor Cst.

A first terminal of the first transistor T1 (driving transistor) may be connected to the first power source VDD, and a second terminal thereof may be electrically connected to the light-emitting element LD. A gate electrode of the first transistor T1 may be connected to a first node N1. The first transistor T1 controls an amount of a driving current supplied to the light-emitting element LD in response to a voltage of the first node N1.

A first terminal of the second transistor T2 (switching transistor) may be connected to the $j^{th}$ data line Dj, and a second terminal thereof may be connected to the first node N1. Here, the first terminal and the second terminal of the second transistor T2 may be different terminals, and for example, in case that the first terminal is a source electrode, the second terminal may be a drain electrode. A gate electrode of the second transistor T2 may be connected to the $i^{th}$ scan line Si.

In case that a scan signal having a voltage, at which the second transistor T2 may be turned on, is supplied from the $i^{th}$ scan line Si, the second transistor T2 may be turned on to electrically connects the $j^{th}$ data line Dj and the first node N1. A data signal of a corresponding frame may be supplied to the $j^{th}$ data line Dj, and thus, the data signal may be transmitted to the first node N1. The data signal transmitted to the first node N1 may be charged in the storage capacitor Cst.

The storage capacitor Cst may be charged with a voltage corresponding to a data signal supplied to the first node N1 and may maintain the charged voltage until a data signal of a next frame is supplied.

Although FIG. 2 illustrates the pixel circuit PXC including the second transistor T2 for transmitting a data signal into the pixel PXL, the storage capacitor Cst for storing the data signal, and the first transistor T1 for supplying a driving current corresponding to the data signal to the light-emitting element LD, the disclosure is not necessarily limited thereto, and the structure of the pixel circuit PXC may be variously changed. As an example, the pixel circuit PXC may further additionally include other circuit elements such as at least one transistor element of a transistor element for compensating for a threshold voltage of the first transistor T1, a transistor element for initializing the first node N1, and/or a transistor element for controlling emission times of the light-emitting elements LD, and a boosting capacitor for boosting a voltage of the first node N1. The first and second transistors T1 and T2 of the pixel circuit PXC are not limited to FIG. 2 and may be variously changed to n-channel metal oxide semiconductors (NMOS) or p-channel metal oxide semiconductors (PMOSs).

Figure 3:
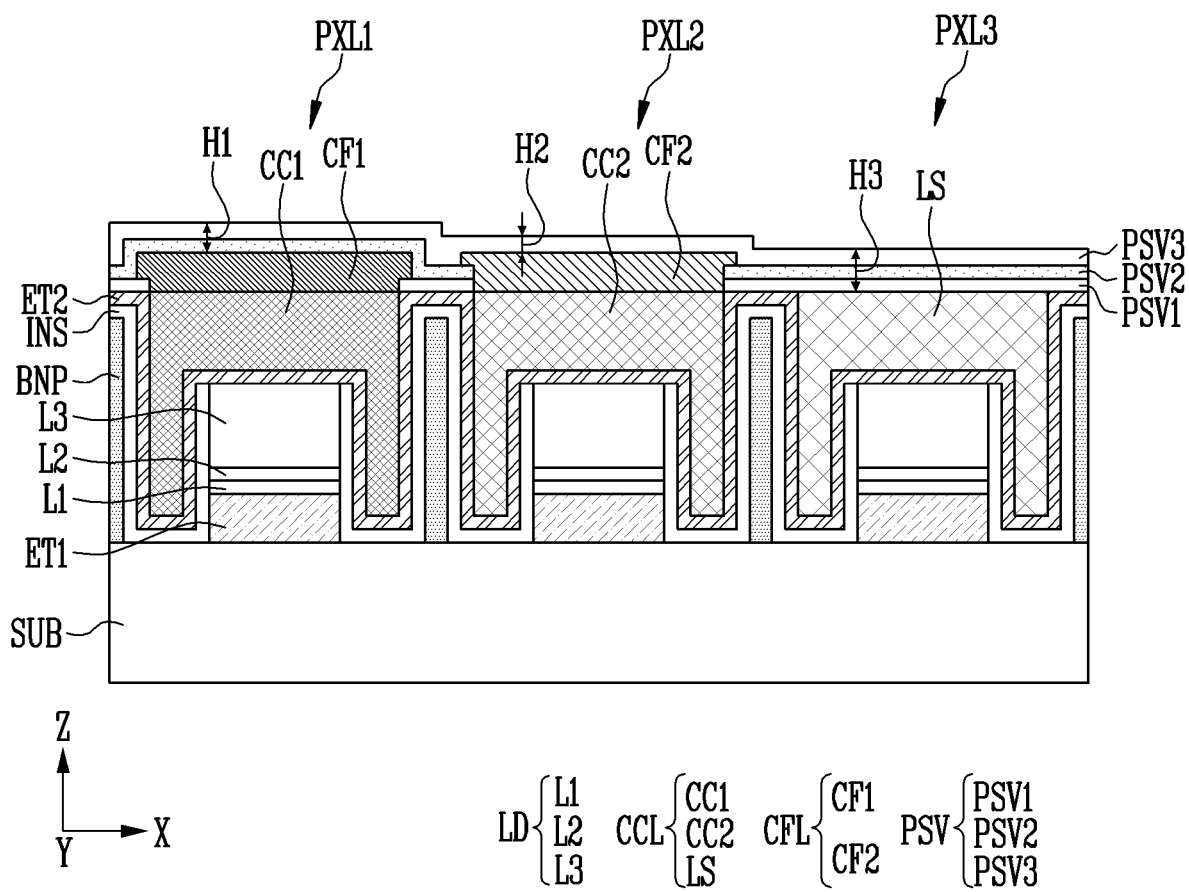
FIG. 3 is a schematic cross-sectional view illustrating pixels according to one embodiment.

FIG. 3 is a schematic cross-sectional view illustrating pixels according to one embodiment.

FIG. 3 schematically illustrates a cross-sectional structure of a first pixel PXL1, a second pixel PXL2, and a third pixel PXL3 which are adjacent to each other.

Referring to FIG. 3, a pixel PXL and a display device including the display device include a substrate SUB, bank patterns BNP disposed on the substrate SUB, light-emitting elements LD, color conversion layers CCL, color filter layers CFL, and protective layers PSV.

The substrate SUB may be a driving substrate including circuit elements or the like such as transistors constituting a pixel circuit PXC (see FIG. 2) of each pixel PXL. As an example, as the substrate SUB, a CMOS substrate made of a combination of an NMOS and a PMOS may be used, but the disclosure is not necessarily limited thereto.

The bank patterns BNP may be disposed at boundaries between the first pixel PXL1, the second pixel PXL2, and the third pixel PXL3 on the substrate SUB. Each of the bank patterns BNP may be provided in a shape extending in one direction or in a direction. For example, each of the bank patterns BNP may be provided on the substrate SUB in a shape extending in a third direction (Z-axis direction) from the substrate SUB. It is to be understood that the figures may also include a first direction (X-axis direction) and a second direction (Y-axis direction).

The bank patterns BNP may include at least one reflective material. The bank patterns BNP may reflect light emitted from the light-emitting elements LD to improve the luminous efficiency of a display panel PNL. Also, the bank patterns BNP may include at least one light blocking material to prevent color mixing between adjacent pixels PXL. According to embodiments, the bank patterns BNP may include an organic material such as an acrylic-based resin, an epoxy resin, a phenolic resin, a polyamide-based resin, a polyimide-based resin, a polyester-based resin, a polyphenylene sulfide-based resin, or benzocyclobutene (BCB). However, the disclosure is not necessarily limited thereto, and the bank patterns BNP may include at least one selected from various types of inorganic materials such as silicon oxide ($SiO_x$), silicon nitride ($SiN_x$), silicon oxynitride ($Si_xO_yN_y$), aluminum nitride ($AlN_x$), aluminum oxide ($AlO_x$), zirconium oxide ($ZrO_x$), hafnium oxide ($HfO_x$), and titanium oxide ($TiO_x$). A reflective layer may be additionally formed on surfaces (for example, sidewalls) of the bank patterns BNP so as to improve luminous efficiency.

The light-emitting elements LD may be respectively disposed in the first to third pixels PXL1, PXL2, and PXL3. The light-emitting elements LD may be disposed between the bank patterns BNP on the substrate SUB.

Each of the light-emitting elements LD may be provided in various shapes. As an example, the light-emitting elements LD may have a rod-like shape or bar-like shape which is long in the third direction (Z-axis direction) (for example, has an aspect ratio greater than one), but the disclosure is not necessarily limited thereto. For example, each of the light-emitting elements LD may have a polygonal column shape in which a diameter of one end or an end portion is different from a diameter of the other end or another end portion. The light-emitting elements LD may be light-emitting diodes (LEDs) manufactured in a micro-size to such an extent as to have a diameter and/or a length ranging from a nanoscale to a microscale. However, the disclosure is not necessarily limited thereto, and the size of the light-emitting element LD may be variously changed to meet the requirements (or design conditions) of a lighting device or a display device to which the light-emitting element LD is applied. It is to be understood that the shapes described herein may also include shapes substantial to the described shapes.

The light-emitting elements LD may each include a first semiconductor layer L1, a second semiconductor layer L3, and an active layer L2 interposed between the first semiconductor layer L1 and the second semiconductor layer L3. As an example, the first semiconductor layer L1, the active layer L2, and the second semiconductor layer L3 of the light-emitting elements LD may be sequentially stacked each other on the substrate SUB in the third direction (Z-axis direction).

The first semiconductor layer L1 of the light-emitting elements LD may include, for example, at least one p-type semiconductor layer. For example, the first semiconductor layer L1 of the light-emitting elements LD may include a p-type semiconductor layer which may include at least one semiconductor material selected from GaN, InAlGaN, AlGaN, InGaN, AlN, and InN and may be doped with a first conductivity-type dopant (or a p-type dopant) including at least one selected from zinc (Zn), iron (Fe), magnesium (Mg), beryllium (Be), cadmium (Cd), silver (Ag), carbon (C), mercury (Hg), lithium (Li), and calcium (Ca). As an example, the first semiconductor layer L1 of the light-emitting elements LD may include a GaN semiconductor material doped with the first conductivity-type dopant (or a p-type dopant), but the disclosure is not necessarily limited thereto. Various materials may constitute the first semiconductor layer L1 of the light-emitting elements LD.

The active layer L2 of the light-emitting elements LD may have any one structure of a single well structure, a multi-well structure, a single quantum well structure, a multi-quantum well (MQW) structure, a quantum dot structure, and a quantum line structure, but the disclosure is not necessarily limited thereto. The active layer L2 of the light-emitting elements LD may include GaN, InGaN, InAlGaN, AlGaN, or AlN. Various materials may constitute the active layer L2 of the light-emitting elements LD.

In case that a signal (or, a voltage) is applied to both end portions of the light-emitting elements LD, electrons and holes are combined to generate electron-hole pairs in the active layer L2, and thus, the light-emitting elements LD emit light. The light emission of each light-emitting element LD may be controlled using such a principle, and thus, the light-emitting element LD may be used as a light source of various light-emitting devices including the pixel PXL of the display device.

According to embodiments, an electron blocking layer may be further disposed between the active layer L2 and the first semiconductor layer L1 of the light-emitting elements LD. The electron blocking layer may block a flow in which electrons supplied from the second semiconductor layer L3 escape to the first semiconductor layer L1, thereby increasing an electron-hole recombination probability in the active layer L2. An energy bandgap of the electron blocking layer may be greater than an energy bandgap of the active layer L2 and/or the first semiconductor layer L1, but the disclosure is not necessarily limited thereto.

According to embodiments, a superlattice layer may be further disposed between the active layer L2 and the second semiconductor layer L3 of the light-emitting elements LD. The superlattice layer may relieve stress of the active layer L2 and the second semiconductor layer L3 to improve the quality of the light-emitting elements LD. As an example, the superlattice layer may be formed in a structure in which InGaN and GaN may be alternately stacked each other, but the disclosure is not necessarily limited thereto.

The second semiconductor layer L3 of the light-emitting elements LD may be disposed on the active layer L2 and may include a semiconductor layer that may be a different type from the first semiconductor layer L1. In one embodiment, the second semiconductor layer L3 of the light-emitting elements LD may include at least one n-type semiconductor layer. For example, the second semiconductor layer L3 of the light-emitting elements LD may be an n-type semiconductor layer which may include any one semiconductor material selected from GaN, InAlGaN, AlGaN, InGaN, AlN, and InN and may be doped with a second conductivity-type dopant (or an n-type dopant) including at least one selected from silicon (Si), tin (Sn), tellurium (Te), selenium (Se), sulfur (S), oxygen (O), titanium (Ti), and germanium (Ge). As an example, the second semiconductor layer L3 of the light-emitting elements LD may include a GaN semiconductor material doped with the second conductivity-type dopant (or an n-type dopant). However, the material constituting the second semiconductor layer L3 of the light-emitting elements LD is not limited thereto, and various materials may constitute the second semiconductor layer L3 of the light-emitting elements LD.

First electrodes ET1 may be disposed between the light-emitting elements LD and the substrate SUB. For example, the first electrode ET1 may be disposed between the first semiconductor layer L1 of the light-emitting elements LD and the substrate SUB, and the first semiconductor layer L1 of the light-emitting elements LD may be electrically connected to the first electrode ET1. The first electrode ET1 may include a metal or a metal oxide. For example, the first electrode ET1 may include one elected from copper (Cu), gold (Au), silver (Ag), chromium (Cr), titanium (Ti), aluminum (Al), nickel (Ni), indium (In), tin (Sn), and an oxide or an ally thereof, but the disclosure is not necessarily limited thereto.

According to embodiments, an insulating film INS may be provided on surfaces of the light-emitting elements LD and/or the bank patterns BNP. The insulating film INS may be provided on side surfaces of the light-emitting elements LD and/or the bank patterns BNP. The insulating film INS may prevent an electrical short circuit that may occur due to the active layer L2 of the light-emitting elements LD contacting conductive materials other than the first and second semiconductor layers L1 and L3. The insulating film INS may minimize surface defects of the light-emitting elements LD, thereby improving the lifespan and luminous efficiency of the light-emitting elements LD.

The insulating film INS may cover or overlap the side surfaces of the light-emitting elements LD and may be partially removed to expose upper surfaces of the light-emitting elements LD. As an example, the insulating film INS may cover or overlap the side surfaces of the light-emitting elements LD and may be partially removed to expose the second semiconductor layer L3 of the light-emitting elements LD.

The insulating film INS may include silicon oxide ($SiO_x$), silicon nitride ($SiN_x$), silicon oxynitride ($SiO_xN_y$), silicon oxycarbide ($SiO_xC_y$), aluminum oxide ($AlO_x$), aluminum nitride ($AlN_x$), zirconium oxide ($ZrO_x$), hafnium oxide ($HfO_x$), or titanium oxide ($TiO_x$), but the disclosure is not necessarily limited thereto.

A second electrode ET2 may be disposed on the light-emitting elements LD. The second electrode ET2 may be disposed on or directly disposed on the upper surfaces of the light-emitting elements LD exposed by the insulating film INS and may contact the second semiconductor layers L3 of the light-emitting elements LD. The second electrode ET2 may be disposed over the first to third pixels PXL1, PXL2, and PXL3.

The second electrode ET2 may be made of various transparent conductive materials. As an example, the second electrode ET2 may include at least one selected from various transparent conductive materials such as indium tin oxide (ITO), indium zinc oxide (IZO), indium tin zinc oxide (ITZO), aluminum zinc oxide (AZO), gallium zinc oxide (GZO), zinc tin oxide (ZTO), and gallium tin oxide (GTO) and may be implemented to be substantially transparent or semi-transparent so as to satisfy transmittance. Accordingly, light emitted from the light-emitting elements LD may pass through the second electrode ET2 to be emitted to the outside of the display panel PNL.

The color conversion layers CCL may be disposed on the light-emitting elements LD. The color conversion layer CCL may be disposed between the bank patterns BNP. The color conversion layer CCL may be provided in a space or an opening defined by the bank patterns BNP.

The color conversion layers CCL may include a first color conversion layer CC1 disposed on the first pixel PXL1, a second color conversion layer CC2 disposed in the second pixel PXL2, and a scattering layer LS disposed in the third pixel PXL3.

In one embodiment, the first to third pixels PXL1, PXL2, and PXL3 may include the light-emitting elements LD that emit light having a same color. For example, the first to third pixels PXL1, PXL2, and PXL3 may include the light-emitting elements LD that emit light having a third color (or blue). The color conversion layer CCL including color conversion particles may be disposed in each of the first to third pixels PXL1, PXL2, and PXL3 to display a full-color image.

In one embodiment, in case that the first pixel PXL1 is a red pixel, the first color conversion layer CC1 may include first quantum dots that convert blue light emitted from a blue light-emitting element into red light. The first quantum dots may absorb blue light and shift a wavelength according to an energy transition to emit red light. In case that the first pixel PXL1 is a different color pixel, the first color conversion layer CC1 may include the first quantum dots corresponding to the color of the first pixel PXL1.

In one embodiment, in case that the second pixel PXL2 is a green a different color pixel, the second color conversion layer CC2 may include second quantum dots that the blue light emitted from the blue light-emitting element into green light. The second quantum dots may absorb blue light and shift a wavelength according to an energy transition to emit green light. In case that the second pixel PXL2 is a different color pixel, the second color conversion layer CC2 may include the second quantum dots corresponding to a color of the second pixel PXL2.

In one embodiment, blue light having a relatively short wavelength in a visible light region is incident on each of the first quantum dots and the second quantum dots, thereby increasing absorption coefficients of the first quantum dots and the second quantum dots. Accordingly, finally, efficiency of light emitted from the first and second pixels PXL1 and PXL2 can be increased, and concurrently, excellent color reproducibility can be secured. A light-emitting unit EMU of the first, second, and third pixels PXL1, PXL2, and PXL3 may be formed using a same color light-emitting elements LD (for example, the blue light-emitting elements LD), thereby increasing the manufacturing efficiency of the display device.

The scattering layer LS may be provided to efficiently use the light having the third color (or blue) emitted from the light-emitting element LD. As an example, in case that the light-emitting element LD is a blue light-emitting element that emits blue light and the third pixel PXL3 is a blue pixel, the scattering layer LS may include scatterers or light scattering particles to efficiently use light emitted from the light-emitting element LD.

For example, the scattering layer LS may include scatterers dispersed in a matrix material such as a base resin. As an example, the scattering layer LS may include a scattering material such as silica, but the structural material of the scatterer is not limited thereto. The scatterer may not be selectively disposed only in the third pixel PXL3 but may also be included in the first color conversion layer CC1 or the second color conversion layer CC2. According to embodiments, the scattering layer LS may be omitted or a transparent polymer may be provided instead of the scattering layer LS.

The color filter layer CFL may be disposed on the color conversion layer CCL. The color filter layer CFL may include a color filter CF1 or CF2 corresponding to a color of each pixel PXL.

The color filter layers CFL may include a first color filter CF1 disposed in the first pixel PXL1 to transmit light emitted from the first pixel PXL1 and a second color filter CF2 disposed in the second pixel PXL2 to selectively transmit light emitted from the second pixel PXL2.

In one embodiment, the first color filter CF1 may be a red color filter and the second color filter CF2 may be a green color filter, but the disclosure is not limited thereto. Hereinafter, in case that an arbitrary color filter of the first color filter CF1 and the second color filter CF2 is to be referred to or at least two color filters thereof are to be collectively referred to, a color filter "CF" will be referred to, or "color filters CF" will be referred to.

The first color filter CF1 may be disposed between the first color conversion layer CC1 and the protective layer PSV to be described below. As an example, the first color filter CF1 may be disposed between the first color conversion layer CC1 and a second protective layer PSV2 to be described below. The first color filter CF1 may overlap the light-emitting element LD and the first color conversion layer CC1 of the first pixel PXL1 in a third direction (Z-axis direction). The first color filter CF1 may include a color filter material that selectively transmits light having a first color (or red). For example, in case that the first pixel PXL1 is a red pixel, the first color filter CF1 may include a red color filter material.

The second color filter CF2 may be disposed between the second color conversion layer CC2 and the protective layer PSV to be described below. As an example, the second color filter CF2 may be disposed between the second color conversion layer CC2 and a third protective layer PSV3 to be described below. The second color filter CF2 may overlap the light-emitting element LD and the second color conversion layer CC2 of the second pixel PXL2 in the third direction (Z-axis direction). The second color filter CF2 may include a color filter material that selectively transmits light having a second color (or green). For example, in case that the second pixel PXL2 is a green pixel, the second color filter CF2 may include a green color filter material.

The protective layer PSV may be disposed on the color conversion layer CCL. The protective layer PSV may include the first to third protective layers PSV1, PSV2, and PSV3 which may be sequentially stacked each other.

The first protective layer PSV1 may be disposed in the third pixel PXL3. The first protective layer PSV1 may be disposed on the scattering layer LS of the third pixel PXL3. As an example, the first protective layer PSV1 may be formed on or directly formed on the scattering layer LS of the third pixel PXL3 to serve to protect the scattering layer LS.

In one embodiment, the first protective layer PSV1 may include openings at least partially exposing the first pixel PXL1 and/or the second pixel PXL2. The openings of the first protective layer PSV1 may be sequentially formed. As described above, in case that the protective layers PSV of the pixels PXL are sequentially opened, the color conversion layer CCL may be selectively injected into the opened pixel PXL. For example, the opening exposing the first pixel PXL1 may be formed in the first protective layer PSV1, and the first color conversion layer CC1 may be selectively injected into the first pixel PXL1 through the opening. The opening exposing the second pixel PXL2 may be formed in the first protective layer PSV1, and the second color conversion layer CC2 may be selectively injected into the second pixel PXL2 through the opening. In a process of injecting the color conversion layer CCL into the open pixel PXL, the first protective layer PSV1 may serve to cover or overlap and protect lower members of the remaining pixels PXL. Accordingly, since the color conversion layer CCL may be selectively injected into the corresponding pixel PXL in a state in which adjacent pixels PXL are masked or protected, processability can be improved. This will be described in detail below with reference to FIGS. 12 to 20.

The first protective layer PSV1 may include an inorganic material such as silicon oxide ($SiO_x$), silicon nitride ($SiN_x$), silicon oxynitride ($SiO_xN_y$), silicon oxycarbide ($SiO_xC_y$), aluminum oxide ($AlO_x$), aluminum nitride ($AlN_x$), zirconium oxide ($ZrO_x$), hafnium oxide ($HfO_x$), or titanium oxide ($TiO_x$), but the disclosure is not necessarily limited thereto.

According to embodiments, the first protective layer PSV1 may include an organic material such as an acrylic-based resin, an epoxy resin, a phenolic resin, a polyamide-based resin, a polyimide-based resin, a polyester-based resin, a polyphenylene sulfide-based resin, or BCB.

The second protective layer PSV2 may be disposed in the first pixel PXL1 and/or the third pixel PXL3. The second protective layer PSV2 may be disposed on the first color filter CF1 of the first pixel PXL1. As an example, the second protective layer PSV2 may be formed on or directly formed on the first color filter CF1 of the first pixel PXL1. The second protective layer PSV2 may be disposed on the first protective layer PSV1 of the third pixel PXL3. As an example, the second protective layer PSV2 may be formed on or directly formed on the first protective layer PSV1 of the third pixel PXL3.

In one embodiment, the second protective layer PSV2 may include an opening exposing the second pixel PXL2. As described above, in case that the second protective layer PSV2 covers or overlaps the first pixel PXL1 and/or the third pixel PXL3 and is partially opened to expose the second pixel PXL2, the second color conversion layer CC2 may be selectively injected into the second pixel PXL2. In a process of injecting the second color conversion layer CC2 into the second pixel PXL2, the second protective layer PSV2 may serve to cover or overlap and protect the remaining pixels PXL. Accordingly, since the second color conversion layer CC2 may be selectively injected into the second pixel PXL2 in a state in which adjacent pixels PXL are masked or protected, processability can be improved. This will be described in detail below with reference to FIGS. 12 to 20.

The second protective layer PSV2 may include an inorganic material such as silicon oxide ($SiO_x$), silicon nitride ($SiN_x$), silicon oxynitride ($SiO_xN_y$), silicon oxycarbide ($SiO_xCy$), aluminum oxide ($AlO_x$), aluminum nitride ($AlN_x$), zirconium oxide ($ZrO_x$), hafnium oxide ($HfO_x$), or titanium oxide ($TiO_x$), but the disclosure is not necessarily limited thereto.

According to embodiments, the second protective layer PSV2 may include an organic material such as an acrylic-based resin, an epoxy resin, a phenolic resin, a polyamide-based resin, a polyimide-based resin, a polyester-based resin, a polyphenylene sulfide-based resin, or BCB. The third protective layer PSV3 may be disposed over the first to third pixels PXL1, PXL2, and PXL3. The third protective layer PSV3 may be disposed on the second protective layer PSV2 of the first pixel PXL1 and/or the third pixel PXL3. As an example, the third protective layer PSV3 may be formed on or directly formed on the second protective layer PSV2 of the first pixel PXL1 and/or the third pixel PXL3. The third protective layer PSV3 may be disposed on the second color filter CF2 of the second pixel PXL2. As an example, the third protective layer PSV3 may be formed on or directly formed on the second color filter CF2 of the second pixel PXL2.

The third protective layer PSV3 may include an inorganic material such as silicon oxide ($SiO_x$), silicon nitride ($SiN_x$), silicon oxynitride ($SiO_xN_y$), silicon oxycarbide ($SiO_xC_y$), aluminum oxide ($AlO_x$), aluminum nitride ($AlN_x$), zirconium oxide ($ZrO_x$), hafnium oxide ($HfO_x$), or titanium oxide ($TiO_x$), but the disclosure is not necessarily limited thereto.

According to embodiments, the third protective layer PSV3 may include an organic material such as an acrylic-based resin, an epoxy resin, a phenolic resin, a polyamide-based resin, a polyimide-based resin, a polyester-based resin, a polyphenylene sulfide-based resin, or BCB.

As described above, in case that the first protective layer PSV1 and/or the second protective layer PSV2 are sequentially opened to selectively inject the color conversion layer CCL into the corresponding pixel PXL among the first to third pixels PXL1, PXL2, and PXL3, the protective layers PSV of the first to third pixels PXL1, PXL2, and PXL3 may have different thicknesses. For example, in case that the first color conversion layer CC1 is injected into the first pixel PXL1 and the second color conversion layer CC2 is injected into the second pixel PXL2, since the first protective layer PSV1 is opened in a process of injecting the first color conversion layer CC1 into the first pixel PXL1, the second protective layer PSV2 and the third protective layer PSV3 may be disposed in the first pixel PXL1. Since the first protective layer PSV1 and the second protective layer PSV2 are opened in a process of injecting the second color conversion layer CC2 into the second pixel PXL2, the third protective layer PSV3 may be disposed in the second pixel PXL2. Since a process of injecting a separate color conversion layer CCL may be omitted, all of the first to third protective layers PSV1, PSV2, and PSV3 may be disposed in the third pixel PXL3. For example, a thickness H3 of the protective layer PSV of the third pixel PXL3 in the third direction (Z-axis direction) may be greater than a thickness H1 of the protective layer PSV of the first pixel PXL1 in the third direction (Z-axis direction) and/or a thickness H2 of the protective layer PSV of the second pixel PXL2 in the third direction (Z-axis direction). The thickness H1 of the protective layer PSV of the first pixel PXL1 in the third direction (Z-axis direction) may be greater than the thickness H2 of the protective layer PSV of the second pixel PXL2 in the third direction (Z-axis direction). FIG. 3 illustrates a case in which the first color conversion layer CC1 is injected into the first pixel PXL1 and the second color conversion layer CC2 is injected into the second pixel PXL2, but the disclosure is not necessarily limited thereto. As an example, according to embodiments, the second color conversion layer CC2 may be injected into the second pixel PXL2, and the first color conversion layer CC1 may be injected into the first pixel PXL1. Since the first protective layer PSV1 is opened in a process of injecting the second color conversion layer CC2 into the second pixel PXL2, the second protective layer PSV2 and the third protective layer PSV3 may be disposed in the second pixel PXL2. Since the first protective layer PSV1 and the second protective layer PSV2 are opened in a process of injecting the first color conversion layer CC1 into the first pixel PXL1, the third protective layer PSV3 may be disposed in the first pixel PXL1. For example, the thickness H2 of the protective layer PSV of the second pixel PXL2 in the third direction (Z-axis direction) may be greater than the thickness H1 of the protective layer PSV of the first pixel PXL1 in the third direction (Z-axis direction).

According to the above-described embodiment, in a state in which adjacent pixels PXL are masked or protected with the protective layer PSV, only the protective layer PSV of the corresponding pixel PXL may be partially opened to selectively inject the color conversion layer CCL into the corresponding pixel PXL. For example, the color conversion layer CCL can be applied on an entire surface of the display panel PNL without separate alignment, thereby improving processability.

Hereinafter, other embodiments will be described. In the following embodiments, the same components as the above-described components will be denoted by the same reference numerals, and repetitive descriptions thereof may be omitted or simplified.

Figure 4:
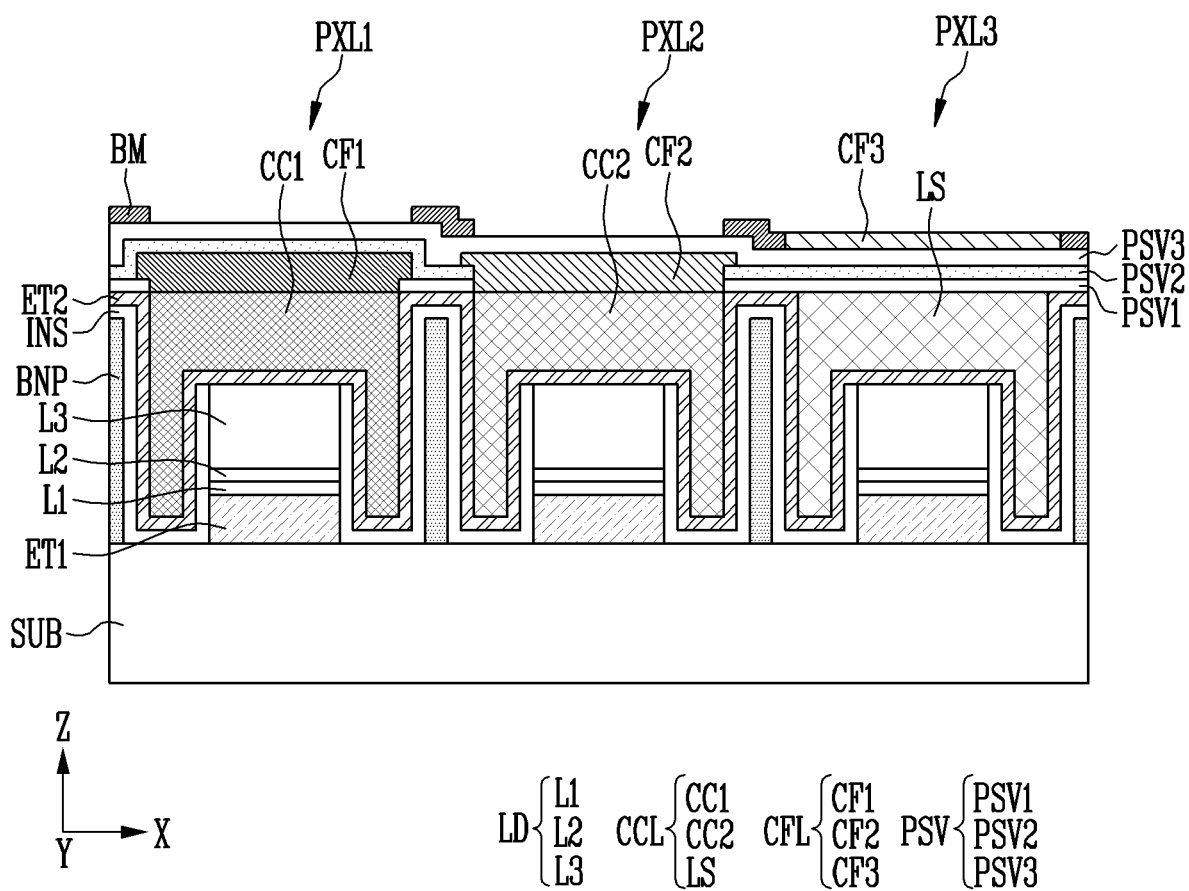
FIG. 4 is a schematic cross-sectional view illustrating a pixel according to an embodiment.

FIG. 4 is a schematic cross-sectional view illustrating a pixel according to an embodiment.

Referring to FIG. 4, an embodiment is different from an embodiment of FIGS. 1 to 3 in that a color filter layer CFL further may include a third color filter CF3 and light blocking layers BM may be further disposed at boundaries between a first pixel PXL1, a second pixel PXL2, and a third pixel PXL3.

The third color filter CF3 may be disposed in the third pixel PXL3 to selectively transmit light emitted from the third pixel PXL3. The third color filter CF3 may be disposed on a third protective layer PSV3. The third color filter CF3 may overlap a light-emitting element LD and a scattering layer LS of the third pixel PXL3 in a third direction (Z-axis direction). The third color filter CF3 may include a color filter material that selectively transmits light having a third color (or blue). For example, in case that the third pixel PXL3 is a blue pixel, the third color filter CF3 may include a blue color filter material.

According to embodiments, the light blocking layer BM may be further disposed on the third protective layer PSV3. The light blocking layers BM are further disposed at the boundaries between the first pixel PXL1, the second pixel PXL2, and the third pixel PXL3. For example, the light blocking layers BM may be provided on bank patterns BNP and overlap the bank patterns BNP in the third direction (Z-axis direction). As described above, in case that the light blocking layers BM are formed at the boundaries between the first pixel PXL1, the second pixel PXL2, and the third pixel PXL3, color mixing defects visible from the front or side of a display device may be more effectively improved. The material of the light blocking layer BM is not particularly limited and may include various light blocking materials.

Since the light-emitting element LD, a color conversion layer CCL, the color filter layer CFL, and/or a protective layer PSV have been described in detail with reference to FIGS. 1 to 3, overlapping details may be omitted.

Figure 5:
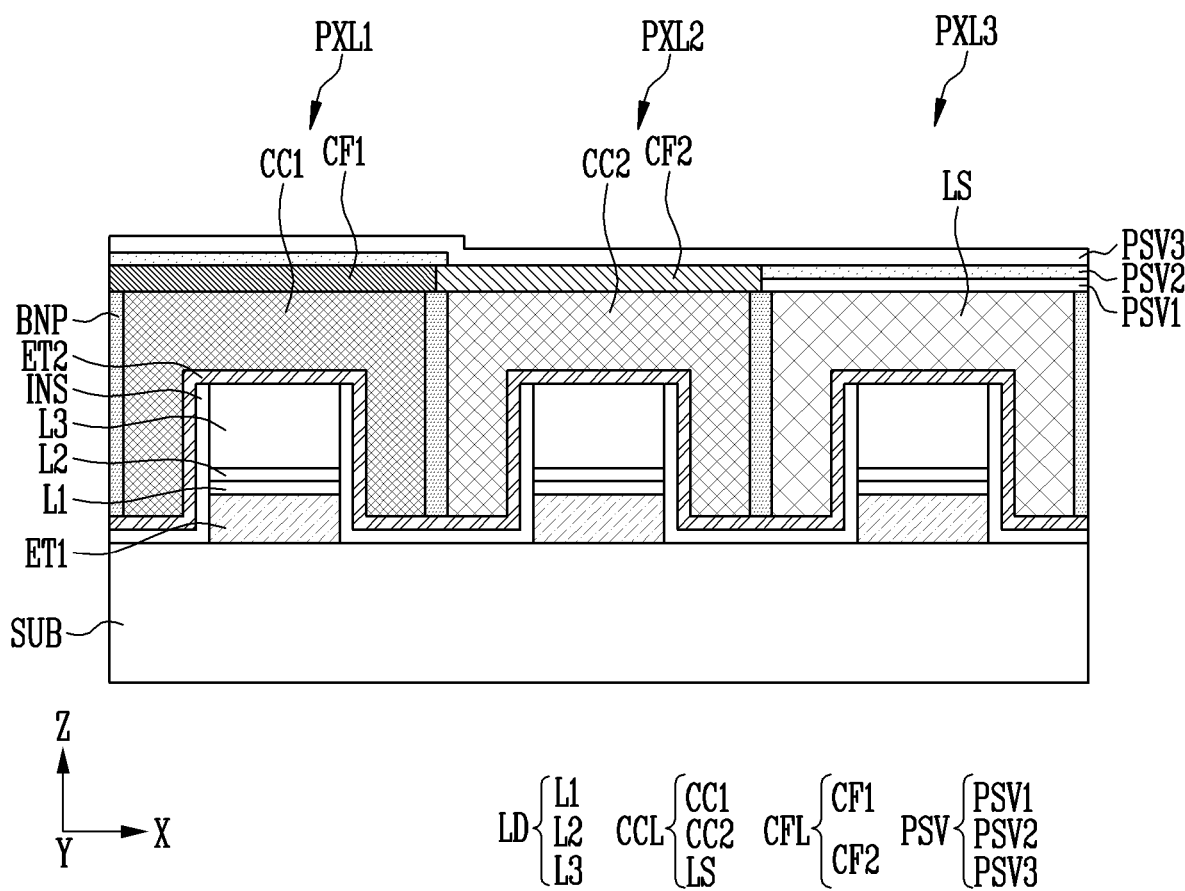
FIG. 5 is a schematic cross-sectional view illustrating a pixel according to an embodiment.

FIG. 5 is a schematic cross-sectional view illustrating a pixel according to an embodiment.

Referring to FIG. 5, an embodiment is different from an embodiment of FIGS. 1 to 3 in that bank patterns BNP may be disposed on a second electrode ET2.

For example, after an insulating film INS and a second electrode ET2 are first formed on light-emitting elements LD, the bank patterns BNP may be formed on the second electrode ET2.

The insulating film INS may be provided on side surfaces of the light-emitting elements LD. The insulating film INS may cover or overlap the side surfaces of the light-emitting elements LD and may be partially removed to expose upper surfaces of the light-emitting elements LD. As an example, the insulating film INS may cover or overlap the side surfaces of the light-emitting elements LD and may be partially removed to expose second semiconductor layers L3 of the light-emitting elements LD.

The second electrode ET2 may be disposed on the insulating film INS. The second electrode ET2 may be disposed on or directly disposed on the upper surfaces of the light-emitting elements LD exposed by the insulating film INS and may contact the second semiconductor layers L3 of the light-emitting elements LD. The second electrode ET2 may be disposed over the first to third pixels PXL1, PXL2, and PXL3.

The bank patterns BNP may be formed on the second electrode ET2. The bank patterns BNP may be disposed at the boundaries between the first pixel PXL1, the second pixel PXL2, and the third pixel PXL3 on the second electrode ET2.

A color conversion layer CCL may be disposed between the bank patterns BNP. The color conversion layer CCL may be disposed on the second electrode ET2 between the bank patterns BNP.

Since the light-emitting element LD, the color conversion layer CCL, a color filter layer CFL, and/or a protective layer PSV have been described in detail with reference to FIGS. 1 to 3, overlapping details may be omitted.

Figure 6:
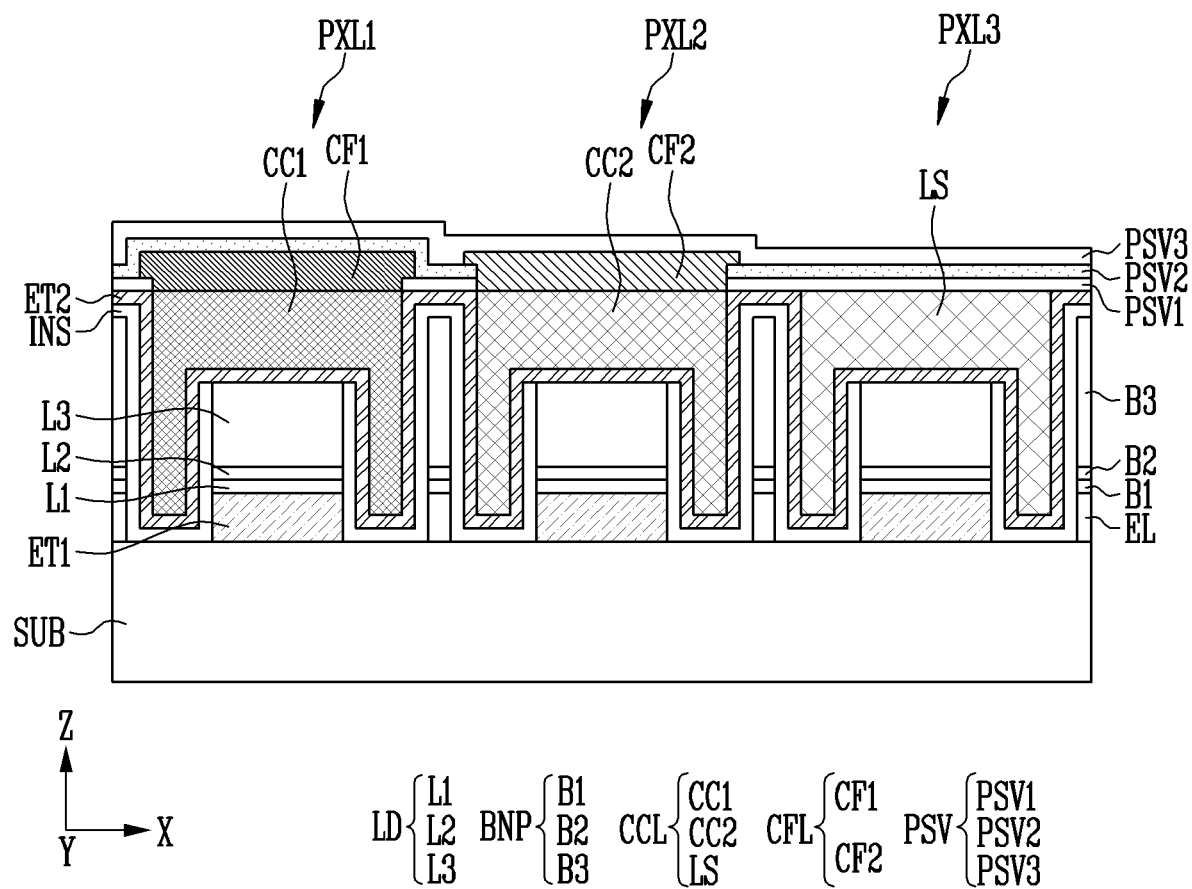
FIG. 6 is a schematic cross-sectional view illustrating a pixel according to an embodiment.

FIG. 6 is a schematic cross-sectional view illustrating a pixel according to an embodiment.

Referring to FIG. 6, an embodiment is different from an embodiment of FIGS. 1 to 3 in that bank patterns BNP may include a same material or a similar material as light-emitting elements LD.

The bank patterns BNP may each include a first semiconductor layer B1, a second semiconductor layer B3, and an active layer B2 interposed between the first semiconductor layer B1 and the second semiconductor layer B3. The first semiconductor layer B1, the active layer B2, and/or the second semiconductor layer B3 of the bank patterns BNP may include the same materials or similar materials as a first semiconductor layer L1, an active layer L2, and/or a second semiconductor layer L3 of the light-emitting elements LD, respectively. The first semiconductor layer L1, the active layer L2, and/or the second semiconductor layer of the light-emitting elements LD may be simultaneously formed in a same process as the first semiconductor layer B1, the active layer B2, and/or the second semiconductor layer B3 of the bank patterns BNP, respectively. Accordingly, a manufacturing process of a display device can be simplified to secure process economical efficiency. This will be described in detail below with reference to FIGS. 24 and 25.

The first semiconductor layer B1, the active layer B2, and the second semiconductor layer B3 of the bank patterns BNP may be sequentially stacked each other on a substrate SUB in a third direction (Z-axis direction).

The first semiconductor layer B1 of the bank patterns BNP may include, for example, at least one p-type semiconductor layer. For example, the first semiconductor layer B1 of the bank patterns BNP may include a p-type semiconductor layer which may include at least one semiconductor material selected from GaN, InAlGaN, AlGaN, InGaN, AlN, and InN and may be doped with a first conductivity-type dopant (or a p-type dopant) including at least one selected from zinc (Zn), iron (Fe), magnesium (Mg), beryllium (Be), cadmium (Cd), silver (Ag), carbon (C), mercury (Hg), lithium (Li), and calcium (Ca). As an example, the first semiconductor layer B1 of the bank patterns BNP may include a GaN semiconductor material doped with the first conductivity-type dopant (or a p-type dopant), but the disclosure is not necessarily limited thereto. Various materials may constitute the first semiconductor layer B1 of the bank patterns BNP.

The active layer B2 of the bank patterns BNP may have any one structure of a single well structure, a multi-well structure, a single quantum well structure, an MQW structure, a quantum dot structure, and a quantum line structure, but the disclosure is not necessarily limited thereto. The active layer B2 of the bank patterns BNP may include GaN, InGaN, InAlGaN, AlGaN, or AlN. Various materials may constitute the active layer B2 of the bank patterns BNP.

The second semiconductor layer B3 of the bank patterns BNP may be disposed on the active layer B2 and may include a semiconductor layer that may be a different type from the first semiconductor layer B1. In one embodiment, the second semiconductor layer B3 of the bank patterns BNP may include at least one n-type semiconductor layer. For example, the second semiconductor layer B3 of the bank patterns BNP may be an n-type semiconductor layer which may include any one semiconductor material selected from GaN, InAlGaN, AlGaN, InGaN, AlN, and InN and may be doped with a second conductivity-type dopant (or an n-type dopant) including at least one selected from silicon (Si), tin (Sn), tellurium (Te), selenium (Se), sulfur (S), oxygen (O), titanium (Ti), and germanium (Ge). As an example, the second semiconductor layer B3 of the bank patterns BNP may include a GaN semiconductor material doped with the second conductivity-type dopant (or an n-type dopant). However, the material constituting the second semiconductor layer L3 of the bank patterns BNP is not limited thereto, and various materials may constitute the second semiconductor layer L3 of the bank patterns BNP.

According to embodiments, an electrode layer EL may be further disposed between the substrate SUB and the bank patterns BNP. The electrode layer EL may include a same material or a similar material as the first electrode ET1 described above. For example, the electrode layer EL may include a metal or a metal oxide. As an example, the electrode layer EL may include one elected from copper (Cu), gold (Au), silver (Ag), chromium (Cr), titanium (Ti), aluminum (Al), nickel (Ni), indium (In), tin (Sn), and an oxide or an alloy thereof, but the disclosure is not necessarily limited thereto. The electrode layer EL and the first electrode ET1 may be simultaneously formed in a same process, but the disclosure is not necessarily limited thereto.

Since the light-emitting element LD, a color conversion layer CCL, a color filter layer CFL, and/or a protective layer PSV have been described in detail with reference to FIGS. 1 to 3, overlapping details may be omitted.

Figure 7:
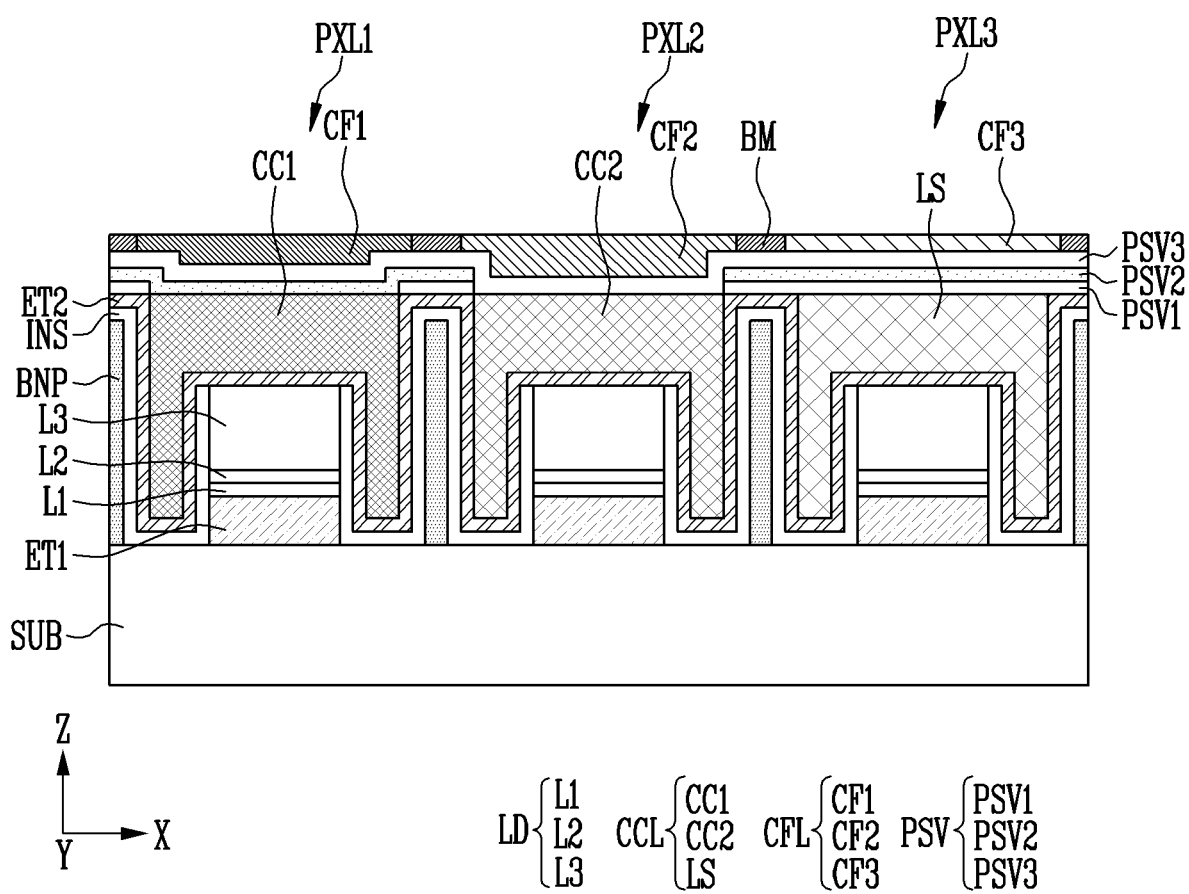
FIG. 7 is a schematic cross-sectional view illustrating a pixel according to an embodiment.

FIG. 7 is a schematic cross-sectional view illustrating a pixel according to an embodiment.

Referring to FIG. 7, an embodiment is different from an embodiment of FIGS. 1 to 3 in that color filter layers CFL and/or light blocking layers BM may be disposed on a protective layer PSV.

The protective layer PSV may be disposed on a color conversion layer CCL. For example, the first protective layer PSV1 may be disposed on a scattering layer LS of a third pixel PXL3. As an example, a first protective layer PSV1 may be formed on or directly formed on the scattering layer LS of the third pixel PXL3 to serve to protect the scattering layer LS.

A second protective layer PSV2 may be disposed on a first color conversion layer CC1 of a first pixel PXL1. As an example, the second protective layer PSV2 may be formed on or directly formed on the first color conversion layer CCL1 of the first pixel PXL1. The second protective layer PSV2 may be disposed on the first protective layer PSV1 of the third pixel PXL3. As an example, the second protective layer PSV2 may be formed on or directly formed on the first protective layer PSV1 of the third pixel PXL3.

A third protective layer PSV3 may be disposed on a second color conversion layer CC2 of a second pixel PXL2. As an example, the third protective layer PSV3 may be formed on or directly formed on the second color conversion layer CC2 of the second pixel PXL2. The third protective layer PSV3 may be disposed on the second protective layer PSV2 of the first pixel PXL1 and/or the third pixel PXL3. As an example, the third protective layer PSV3 may be formed on or directly formed on the second protective layer PSV2 of the first pixel PXL1 and/or the third pixel PXL3.

The color filter layer CFL may be disposed on the third protective layer PSV3. For example, first to third color filters CF1, CF2, and CF3 may be disposed in the first to third pixels PXL1, PXL2, and PXL3 on the third protective layer PSV3, respectively. The first to third color filters CF1, CF2, and CF3 may be formed on or directly formed on the third protective layer PSV3.

According to embodiments, the light blocking layer BM may be further disposed on the third protective layer PSV3. The light blocking layers BM may be disposed at boundaries between the first pixel PXL1, the second pixel PXL2, and the third pixel PXL3. For example, the light blocking layers BM may be disposed between the first color filter CF1, the second color filter CF2, and the third color filter CF3. As described above, in case that the light blocking layers BM are formed at the boundaries between the first pixel PXL1, the second pixel PXL2, and the third pixel PXL3, color mixing defects visible from the front or side of a display device may be more effectively improved. The material of the light blocking layer BM is not particularly limited and may include various light blocking materials.

Since a light-emitting element LD, the color conversion layer CCL, the color filter layer CFL, and/or the protective layer PSV have been described in detail with reference to FIGS. 1 to 3, overlapping details may be omitted.

Subsequently, a method of manufacturing the display device according to the above-described embodiment will be described.

FIGS. 8 to 20 are schematic cross-sectional views of processes of a method of manufacturing a display device according to one embodiment. FIGS. 8 to 20 are schematic cross-sectional views for describing a method of manufacturing the display devices of FIGS. 3 and 4. Components substantially the same as those of FIGS. 3 and 4 are denoted by the same reference numerals, and detailed reference numerals are omitted.

Figure 8:
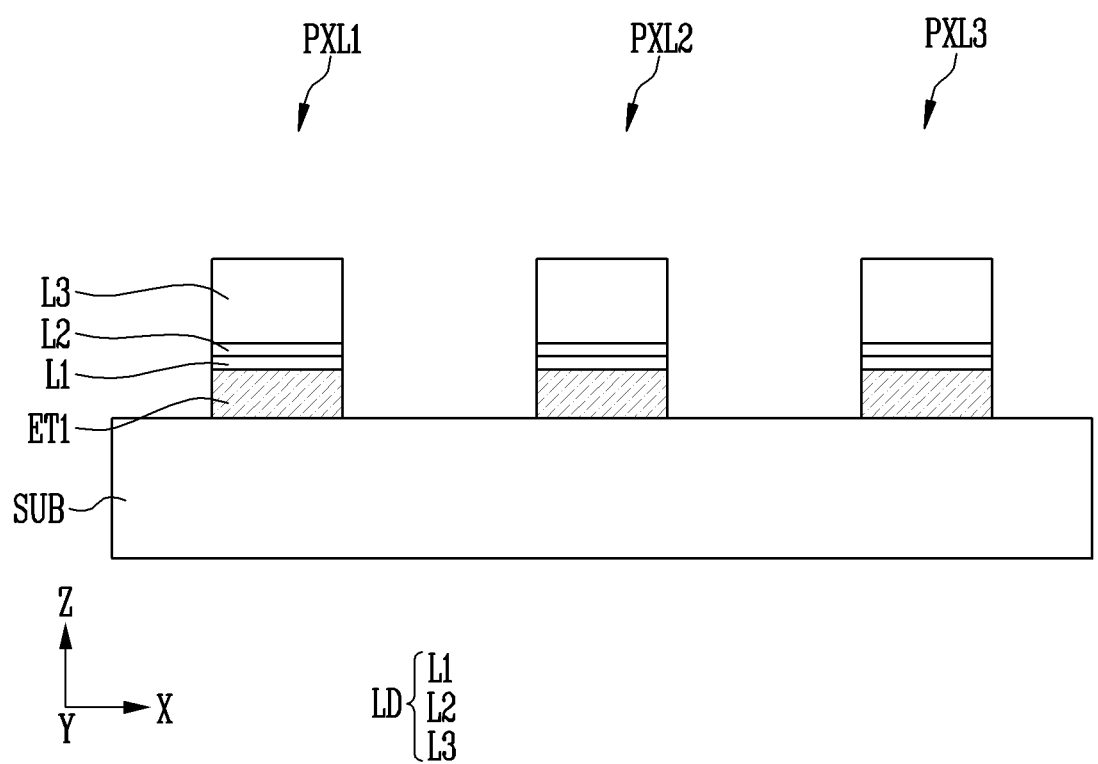
FIGS. 8 to 20 are schematic cross-sectional views of processes of a method of manufacturing a display device according to one embodiment.

First, referring to FIG. 8, light-emitting elements LD are provided in first to third pixels PXL1, PXL2, and PXL3 of a substrate SUB. The substrate SUB may be a driving substrate including circuit elements or the like such as transistors constituting a pixel circuit PXC (see FIG. 2) of each pixel PXL. The light-emitting elements LD may be provided in the form in which a first semiconductor layer L1, an active layer L2, and a second semiconductor layer L3 may be sequentially stacked each other on the substrate SUB in a third direction (Z-axis direction). First electrodes ET1 may be provided between the light-emitting elements LD and the substrate SUB. The light-emitting elements LD may be connected to or coupled to the substrate SUB through the first electrodes ET1.

Figure 9:
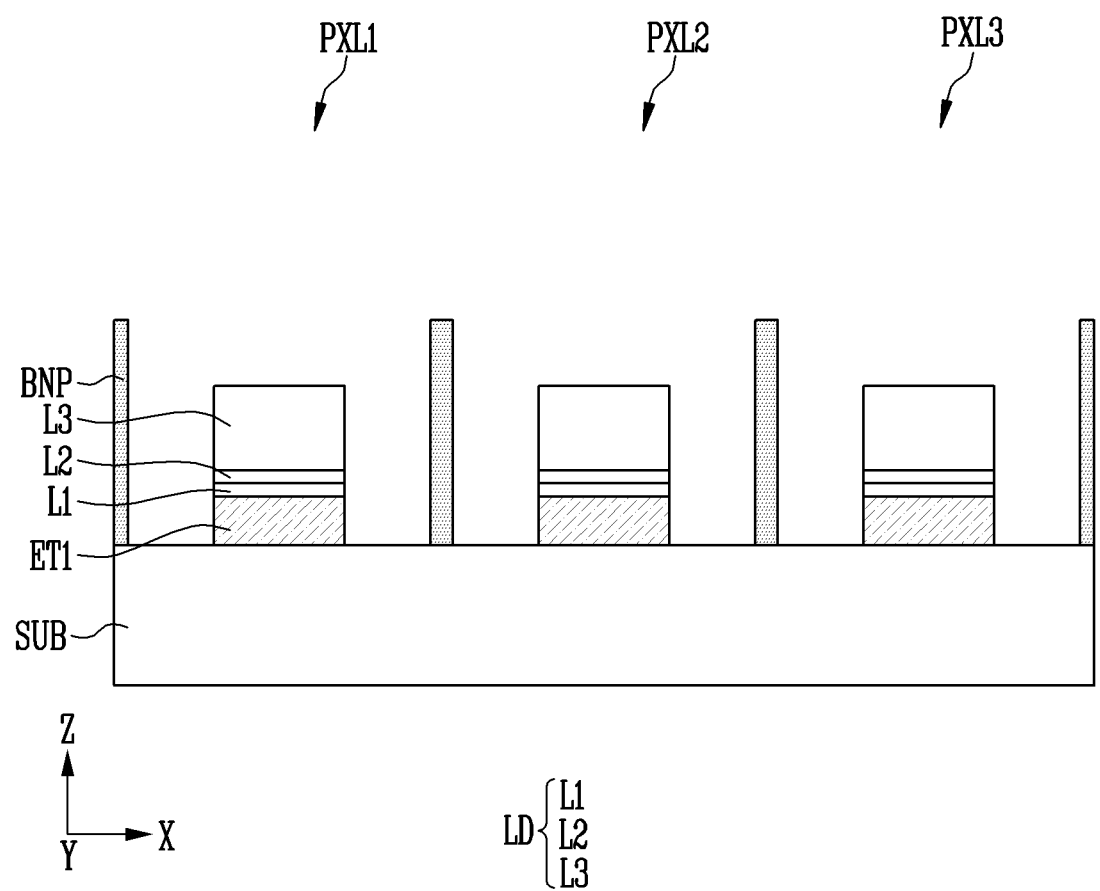

Referring to FIG. 9, bank patterns BNP are provided at boundaries between the first pixel PXL1, the second pixel PXL2, and the third pixel PXL3. The bank patterns BNP may be formed between the light-emitting elements LD. The bank patterns BNP may include at least one reflective material. The bank patterns BNP may reflect light emitted from the light-emitting elements LD to improve the luminous efficiency of a display panel PNL. The bank patterns BNP may include at least one light blocking material to prevent color mixing between adjacent pixels PXL. However, the disclosure is not necessarily limited thereto, and the material of the bank patterns BNP may be variously changed according to embodiments.

Figure 10:
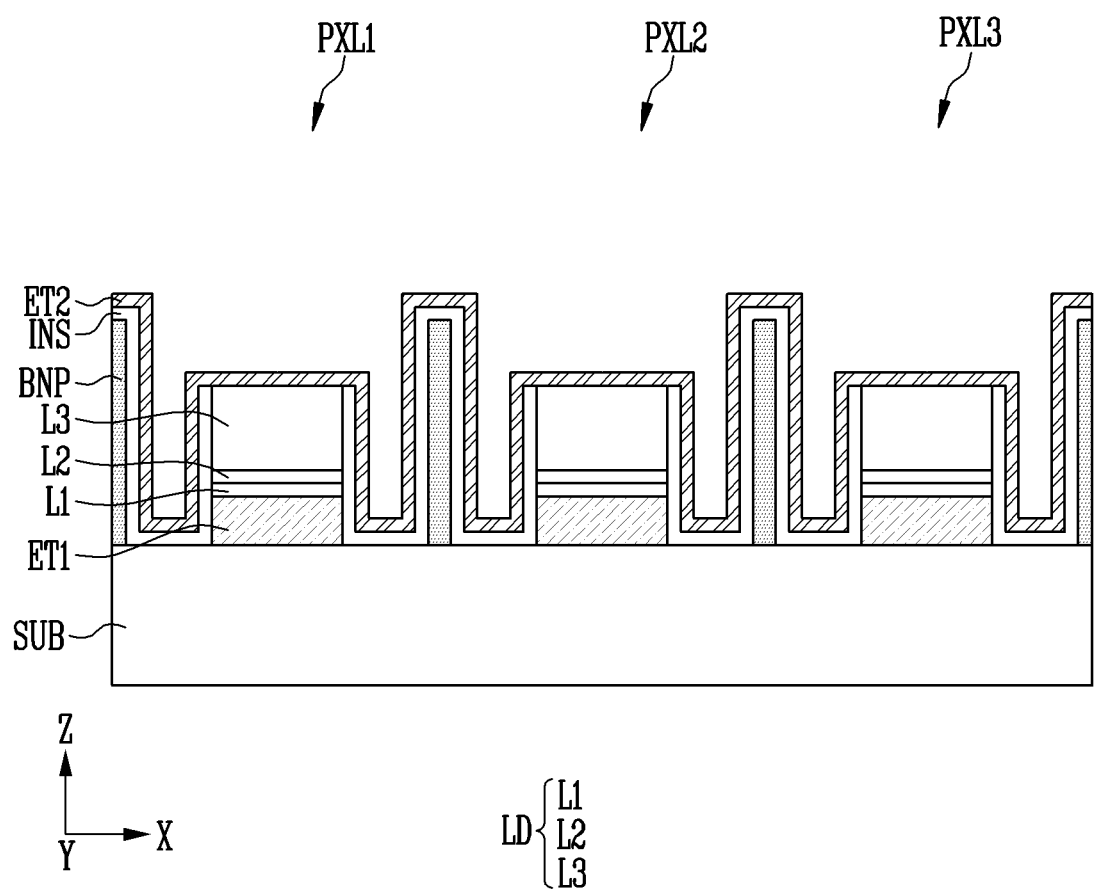

Referring to FIG. 10, an insulating film INS and a second electrode ET2 are provided on the light-emitting elements LD and/or the bank patterns BNP. The insulating film INS may be formed on side surfaces of the light-emitting elements LD and/or the bank patterns BNP. The insulating film INS may prevent an electrical short circuit that may occur due to the active layer L2 of the light-emitting elements LD contacting conductive materials other than the first and second semiconductor layers L1 and L3. The insulating film INS may minimize surface defects of the light-emitting elements LD, thereby improving the lifespan and luminous efficiency of the light-emitting elements LD.

The insulating film INS may cover or overlap the side surfaces of the light-emitting elements LD and may be partially removed to expose upper surfaces of the light-emitting elements LD. As an example, the insulating film INS may cover or overlap the side surfaces of the light-emitting elements LD and may be partially removed to expose the second semiconductor layer L3 of the light-emitting elements LD.

The second electrode ET2 may be formed on the insulating film INS. The second electrode ET2 may be formed on or directly formed on the upper surfaces of the light-emitting elements LD exposed by the insulating film INS and may contact the second semiconductor layers L3 of the light-emitting elements LD. The second electrode ET2 may be formed over the first to third pixels PXL1, PXL2, and PXL3.

Figure 11:
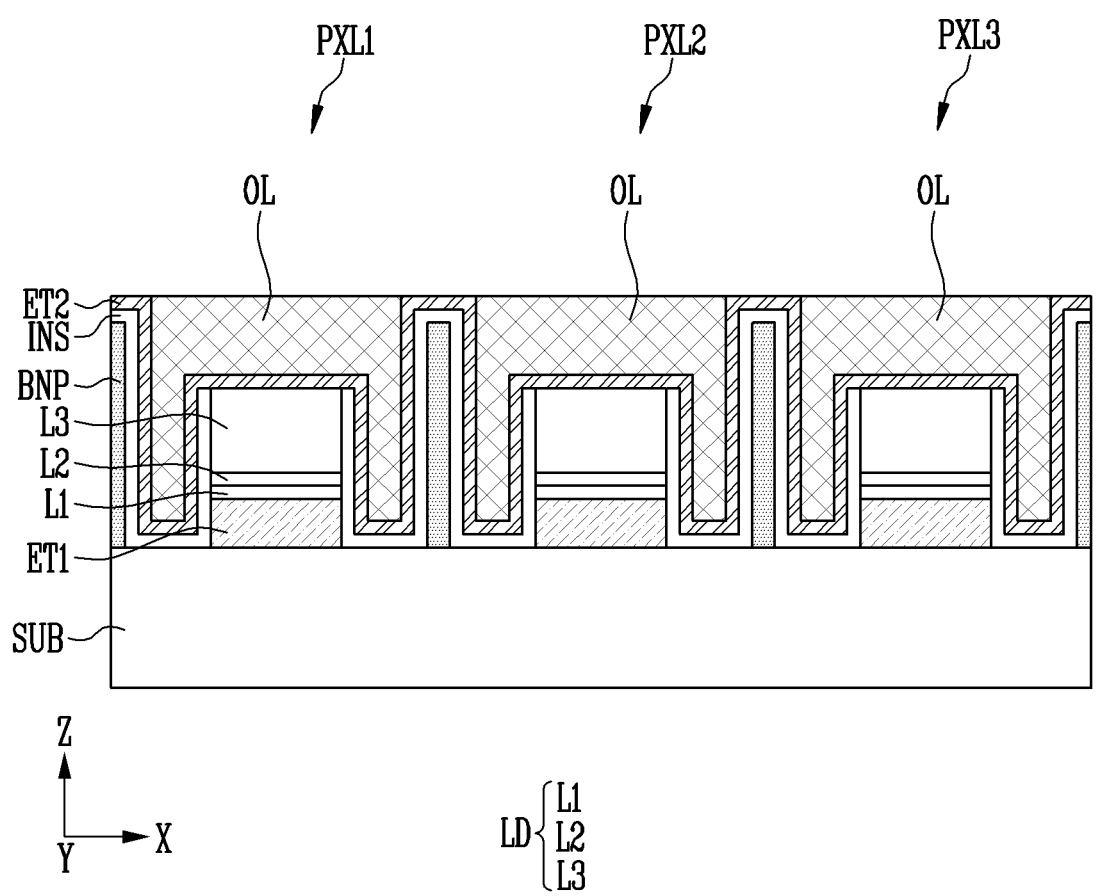

Referring to FIG. 11, organic layers OL are provided between the bank patterns BNP. The organic layers OL may be disposed on the light-emitting elements LD between the bank patterns BNP.

The organic layer OL may be disposed in each of the first to third pixels PXL1, PXL2, and PXL3. The organic layers OL of some or a number of pixels PXL among the first to third pixels PXL1, PXL2, and PXL3 may be sequentially removed in a subsequent process to provide a space in which a color conversion layer CCL may be provided. The organic layer OL of at least one of the first to third pixels PXL1, PXL2, and PXL3 may function as a scattering layer LS (see FIG. 3). To this end, the organic layer OL may include a same material or a similar material as the scattering layer LS. As an example, the organic layer OL may include scatterers or light scattering particles so as to efficiently use light emitted from the light-emitting element LD. For example, the organic layer OL may include scatterers dispersed in a matrix material such as a base resin. As an example, the organic layer OL may include a scatterer such as silica, but the structural of the scatterer is not limited thereto. According to embodiments, the scatterer may be omitted, and the organic layer OL made of a transparent polymer may be provided.

Figure 12:
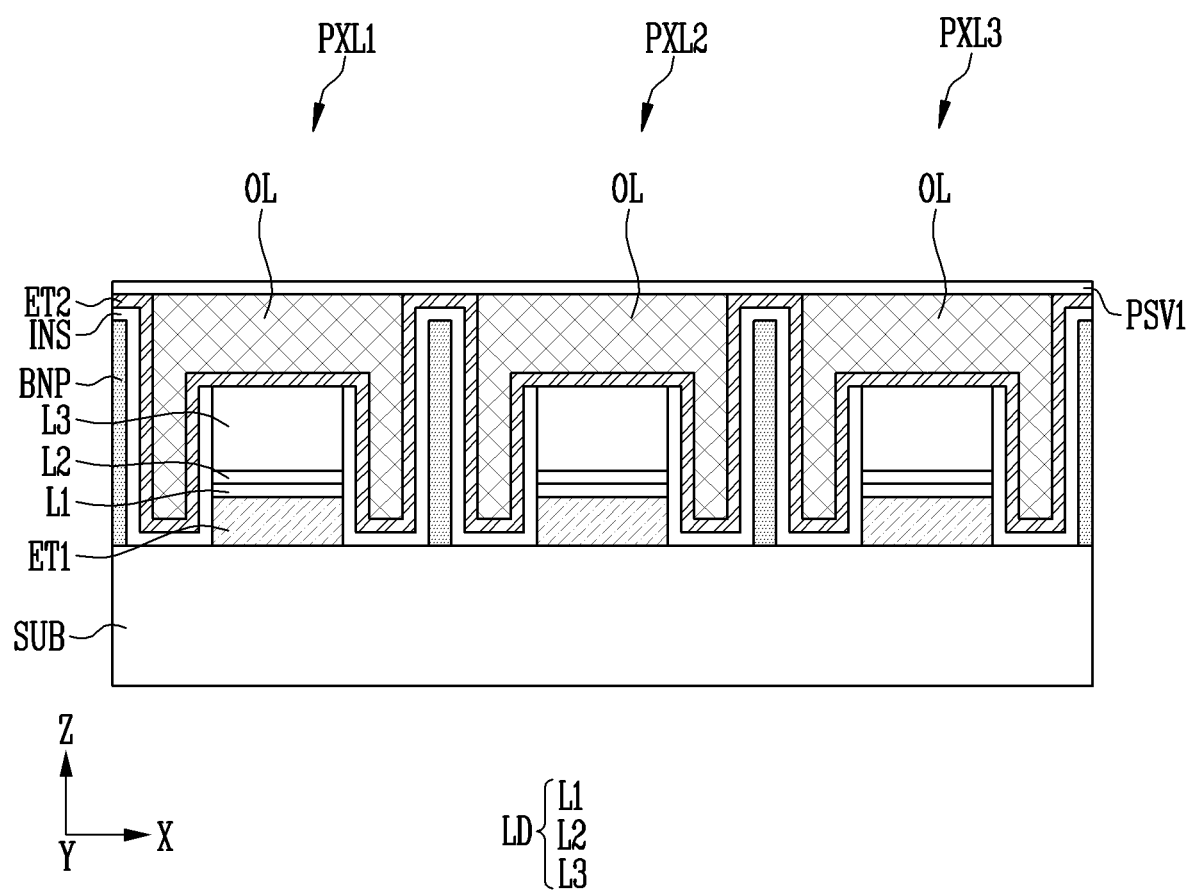

Referring to FIG. 12, a first protective layer PSV1 is provided on the organic layer OL. The first protective layer PSV1 may be formed over the first to third pixels PXL1, PXL2, and PXL3. As an example, the first protective layer PSV1 may be formed on or directly formed on the organic layer OL to serve to protect the organic layer OL.

The first protective layer PSV1 may be made of an inorganic material such as silicon oxide ($SiO_x$), silicon nitride ($SiN_x$), silicon oxynitride ($SiO_xN_y$), silicon oxycarbide ($SiO_xC_y$), aluminum oxide ($AlO_x$), aluminum nitride ($AlN_x$), zirconium oxide ($ZrO_x$), hafnium oxide ($HfO_x$), or titanium oxide ($TiO_x$), but the disclosure is not necessarily limited thereto.

Figure 13:
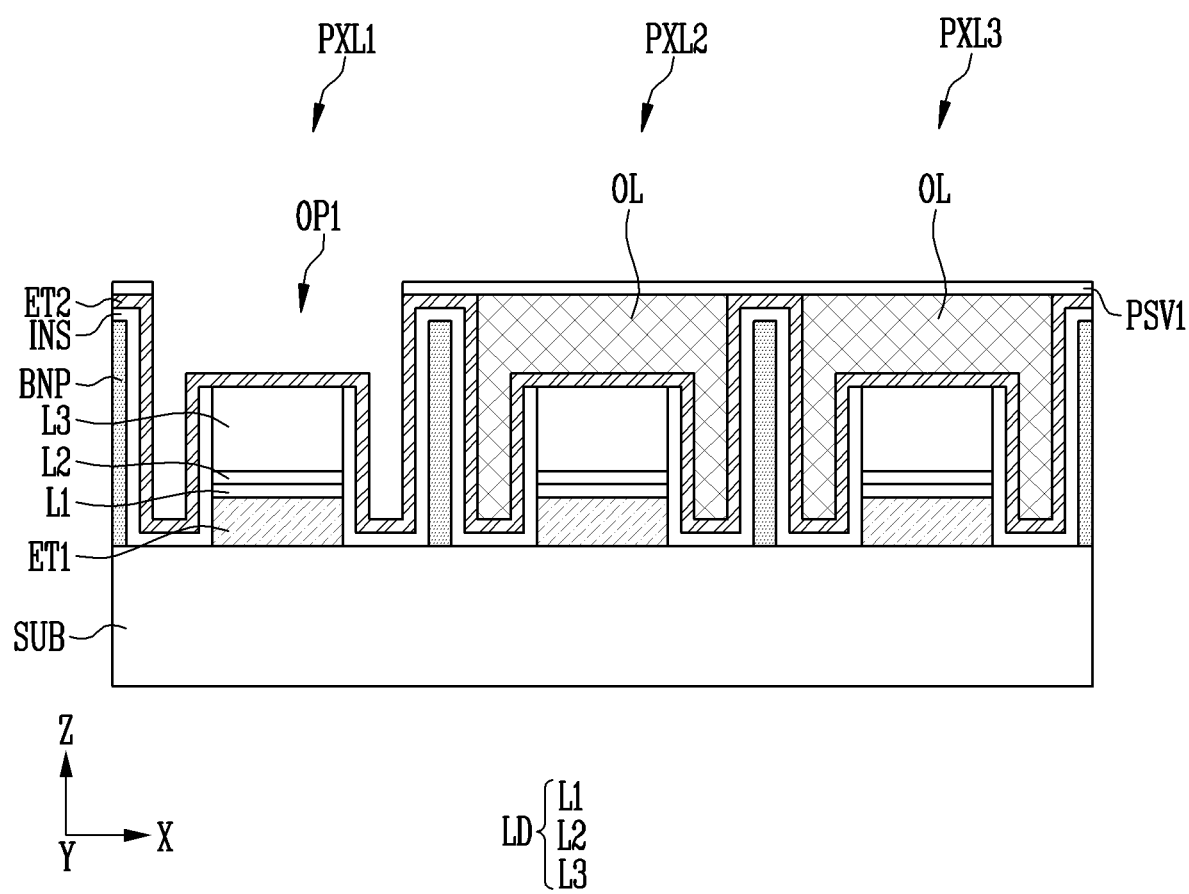

Referring to FIG. 13, the organic layer OL and the first protective layer PSV1 of the first pixel PXL1 are removed. As an example, the first protective layer PSV1 may be partially removed to form a first opening OP1 exposing the first pixel PXL1, and the organic layer OL of the first pixel PXL1 may be removed through the first opening OP1.

In a process of removing the organic layer OL and the first protective layer PSV1 of the first pixel PXL1, the remaining pixels PXL, for example, the second pixel PXL2 and the third pixel PXL3 may be covered or overlapped by the first protective layer PSV1. As an example, in the process of removing the organic layer OL and the first protective layer PSV1 of the first pixel PXL1, the organic layer OL of the second pixel PXL2 and the organic layer OL of the third pixel PXL3 may be protected by the first protective layer PSV1. For example, the first opening OP1 exposing the first pixel PXL1 may be formed in a state in which adjacent pixels PXL are masked or protected with the first protective layer PSV1.

Figure 14:
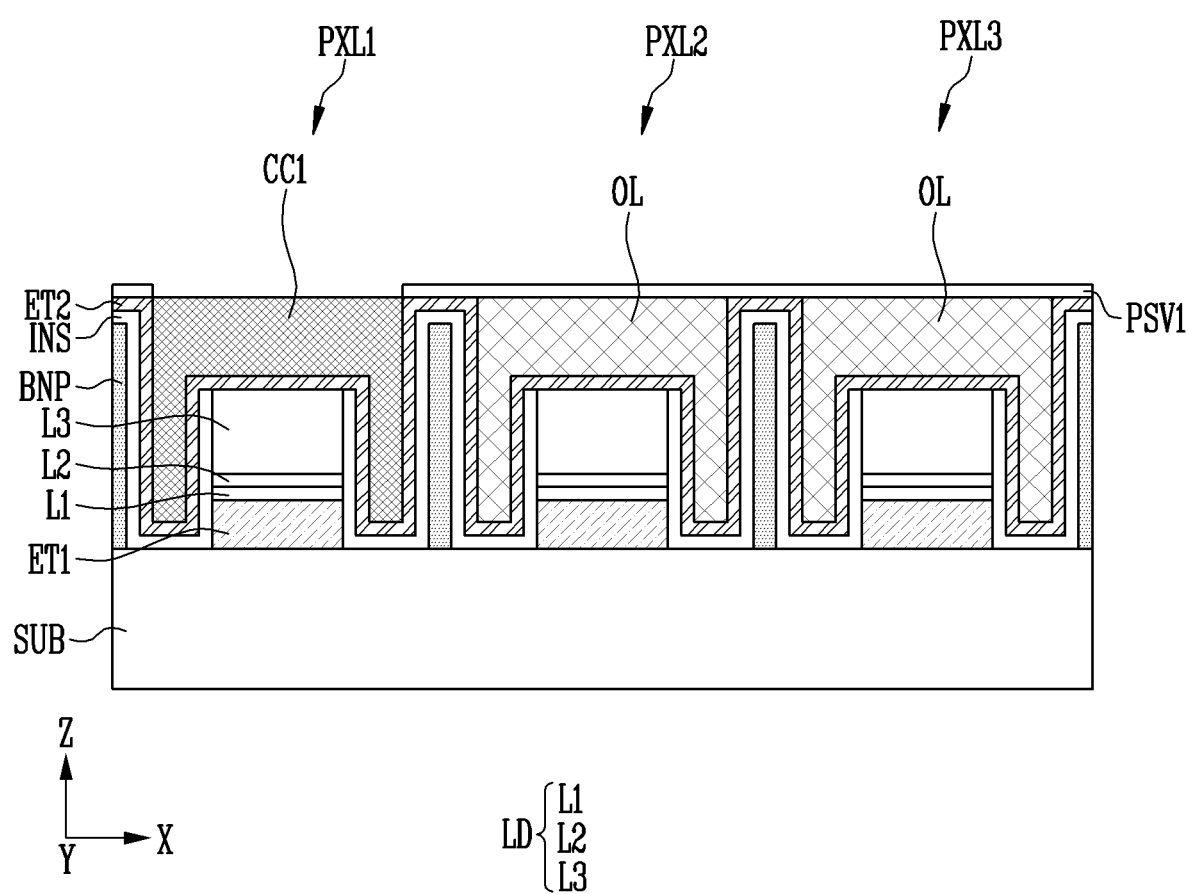

Referring to FIG. 14, a first color conversion layer CC1 is provided between the bank patterns BNP of the first pixel PXL1 from which the organic layer OL and the first protective layer PSV1 are removed. The first color conversion layer CC1 may be selectively injected into the first pixel PXL1 through the first opening OP1 of the first protective layer PSV1. In a process of injecting the first color conversion layer CC1 into the opened first pixel PXL1, the first protective layer PSV1 may cover or overlap and protect the remaining pixels PXL. As an example, in the process of injecting the first color conversion layer CC1 into the first pixel PXL1, the first protective layer PSV1 may serve to protect the organic layers OL of the second pixel PXL2 and the third pixel PXL3. Accordingly, since the first color conversion layer CC1 may be selectively injected into the first pixel PXL1 in a state in which adjacent pixels PXL are masked or protected, processability can be improved.

Figure 15:
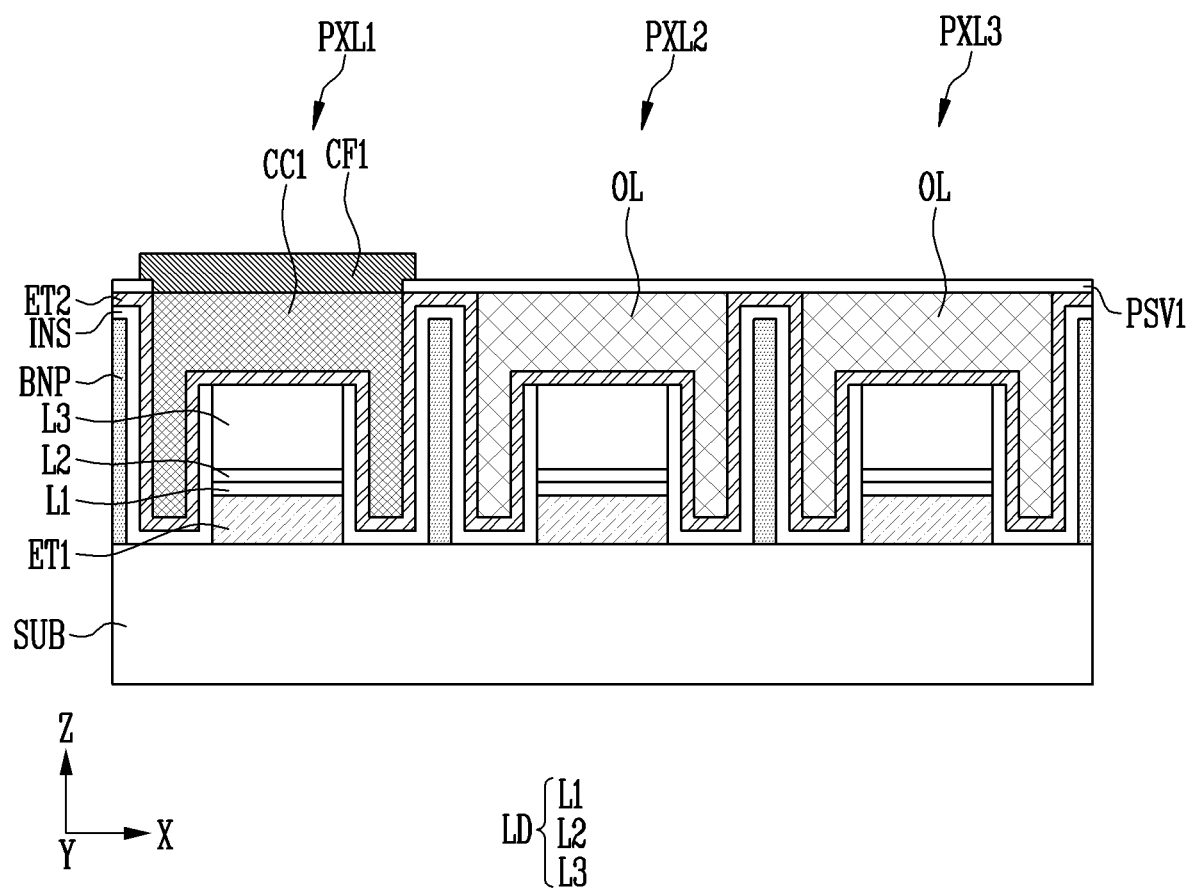

Referring to FIG. 15, a first color filter CF1 is provided on the first color conversion layer CC1. The first color filter CF1 may be formed on or directly formed on the first color conversion layer CC1. The first color filter CF1 may overlap the light-emitting element LD and the first color conversion layer CC1 of the first pixel PXL1 in the third direction (Z-axis direction). The first color filter CF1 may include a color filter material that selectively transmits light having a first color (or red). For example, in case that the first pixel PXL1 is a red pixel, the first color filter CF1 may include a red color filter material.

Figure 16:
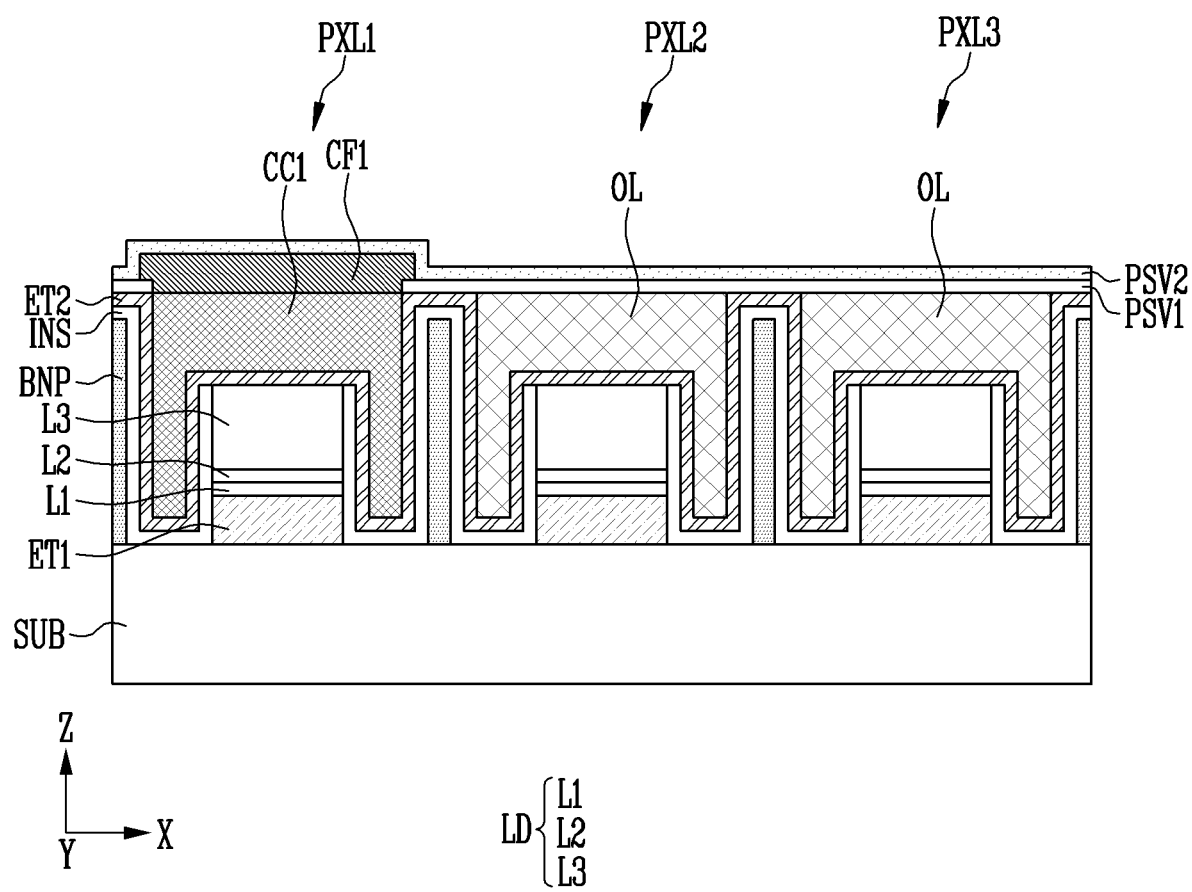

Referring to FIG. 16, a second protective layer PSV2 is provided. The second protective layer PSV2 may be formed over the first to third pixels PXL1, PXL2, and PXL3. As an example, the second protective layer PSV2 may be formed on the first color conversion layer CC1 and the first color filter CF1 of the first pixel PXL1. The second protective layer PSV2 may be formed on or directly formed on the first color filter CF1 of the first pixel PXL1, but the disclosure is not necessarily limited thereto. The second protective layer PSV2 may be formed on the first protective layer PSV1 of the second pixel PXL2. The second protective layer PSV2 may be formed on or directly formed on the first protective layer PSV1 of the second pixel PXL2, but the disclosure is not necessarily limited thereto. The second protective layer PSV2 may be disposed on the first protective layer PSV1 of the third pixel PXL3. The second protective layer PSV2 may be formed on or directly formed on the first protective layer PSV1 of the third pixel PXL3, but the disclosure is not necessarily limited thereto.

The second protective layer PSV2 may be made of an inorganic material such as silicon oxide ($SiO_x$), silicon nitride ($SiN_x$), silicon oxynitride ($SiO_xN_y$), silicon oxycarbide ($SiO_xC_y$), aluminum oxide ($AlO_x$), aluminum nitride ($AlN_x$), zirconium oxide ($ZrO_x$), hafnium oxide ($HfO_x$), or titanium oxide ($TiO_x$), but the disclosure is not necessarily limited thereto.

Figure 17:
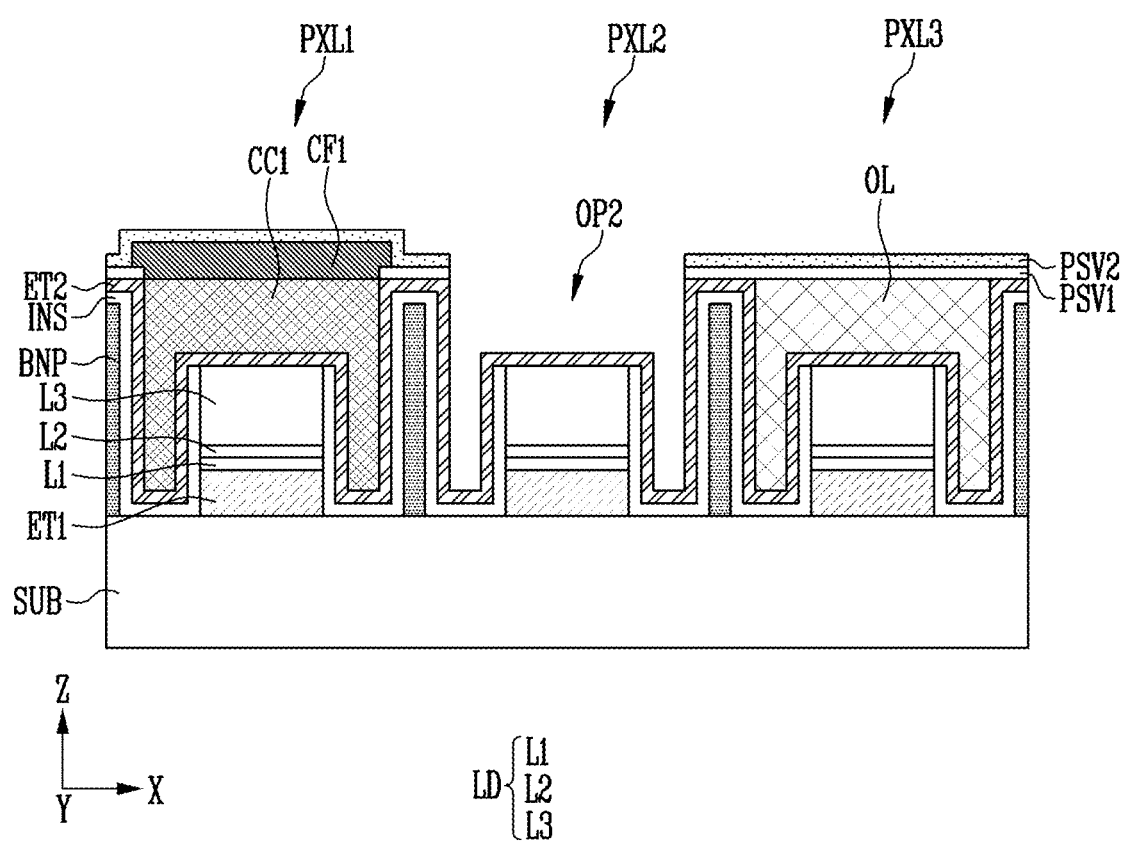

Referring to FIG. 17, the organic layer OL, the first protective layer PSV1, and the second protective layer PSV2 of the second pixel PXL2 are removed. As an example, the first protective layer PSV1 and the second protective layer PSV2 may be partially removed to form a second opening OP2 exposing the second pixel PXL2, and the organic layer OL of the second pixel PXL2 may be removed through the second opening OP2.

In a process of removing the organic layer OL, the first protective layer PSV1, and the second protective layer PSV2 of the second pixel PXL2, the first pixel PXL1 and the third pixel PXL3 may be covered or overlapped by the second protective layer PSV2. For example, the second opening OP2 exposing the second pixel PXL2 may be formed in a state in which adjacent pixels PXL are masked or protected with the second protective layer PSV2.

Figure 18:
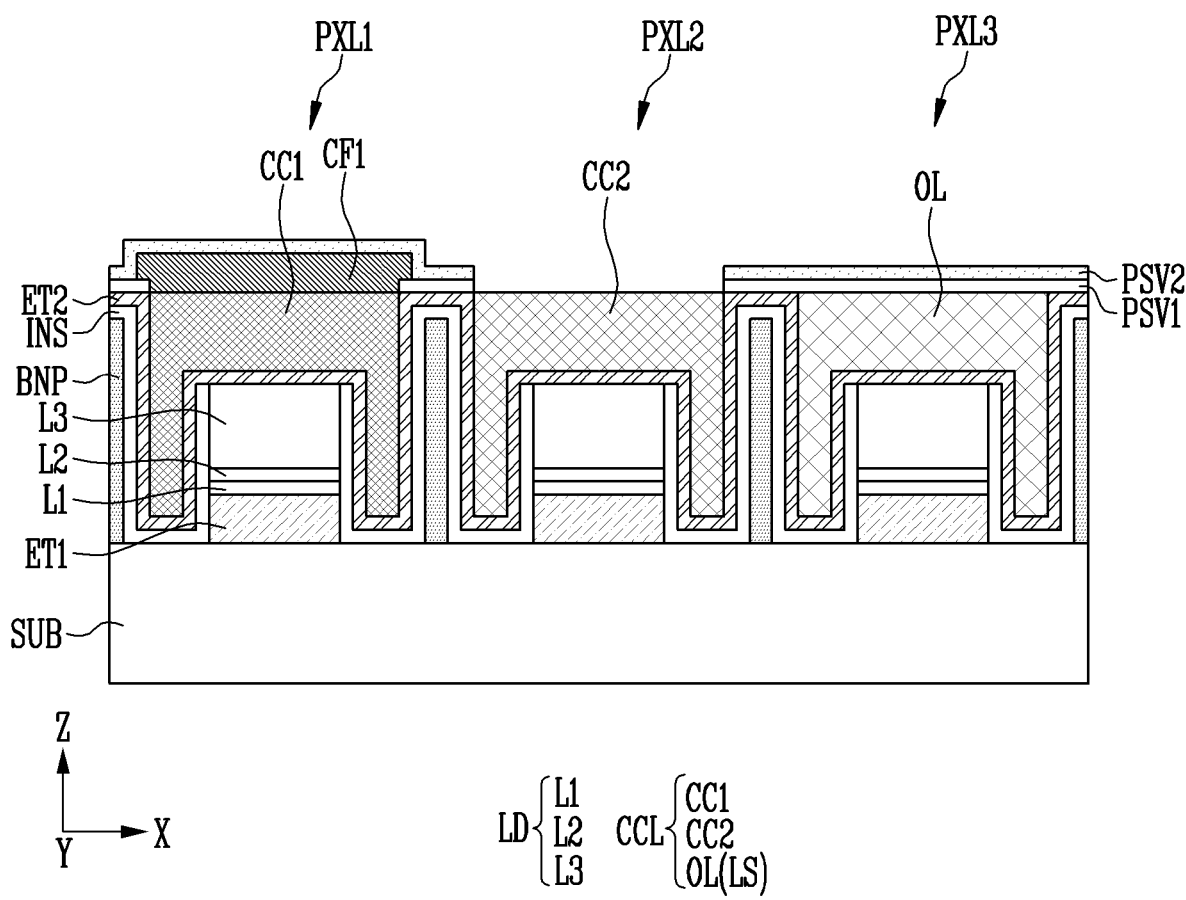

Referring to FIG. 18, a second color conversion layer CC2 is provided between the bank patterns BNP of the second pixel PXL2 from which the organic layer OL, the first protective layer PSV1, and the second protective layer PSV2 are removed. The second color conversion layer CC2 may be selectively injected into the second pixel PXL2 through the second opening OP2 of the second protective layer PSV2. In a process of injecting the second color conversion layer CC2 into the exposed second pixel PXL2, the second protective layer PSV2 may serve to cover or overlap and protect the remaining pixels PXL. As an example, in the process of injecting the second color conversion layer CC2 into the second pixel PXL2, the second protective layer PSV2 may serve to protect the first pixel PXL1 and the third pixel PXL3. Accordingly, since the second color conversion layer CC2 may be selectively injected into the second pixel PXL2 in a state in which adjacent pixels PXL are masked or protected, processability can be improved as described above.

Figure 19:
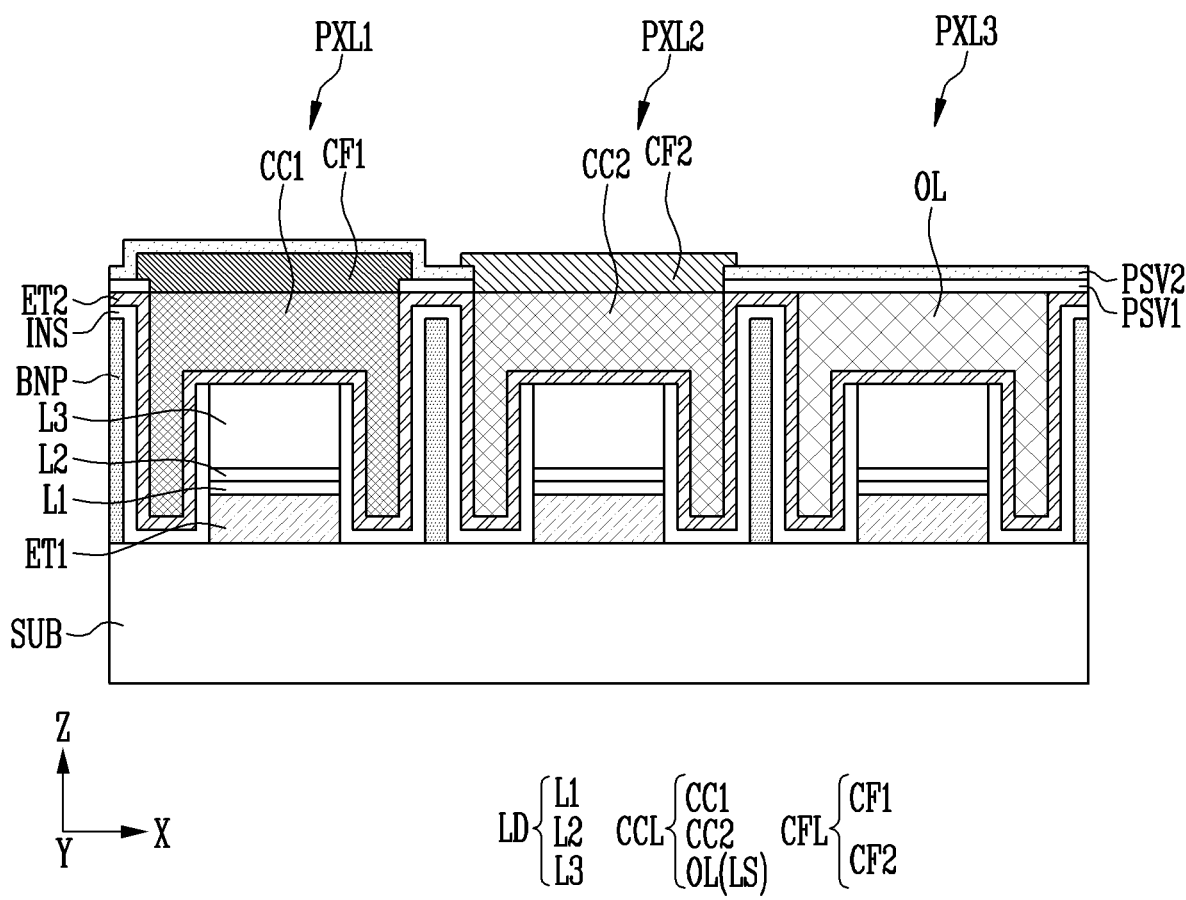

Referring to FIG. 19, a second color filter CF2 is provided on the second color conversion layer CC2. The second color filter CF2 may be formed on or directly formed on the second color conversion layer CC2. The second color filter CF2 may overlap the light-emitting element LD and the second color conversion layer CC2 of the second pixel PXL2 in the third direction (Z-axis direction). The second color filter CF2 may include a color filter material that selectively transmits light having a second color (or green). For example, in case that the second pixel PXL2 is a green pixel, the second color filter CF2 may include a green color filter material.

Figure 20:
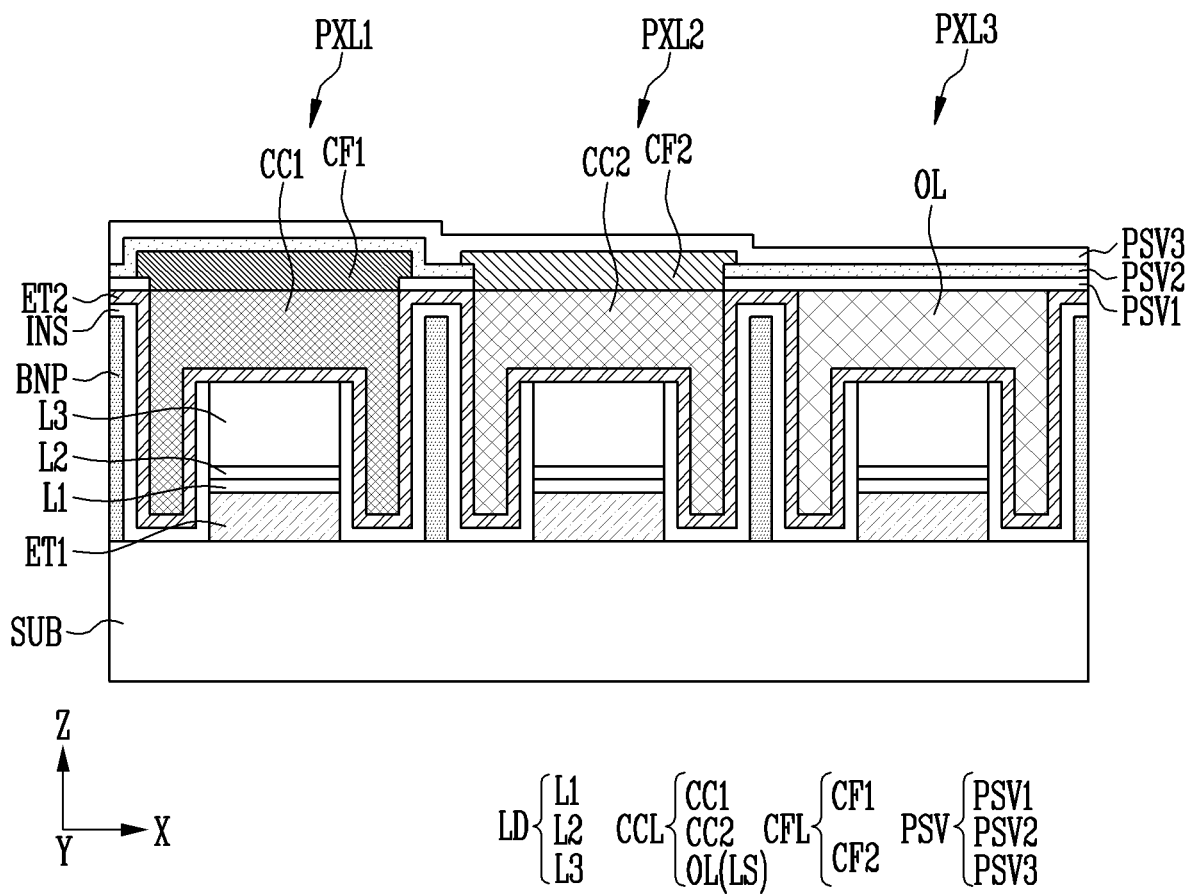

Referring to FIG. 20, the display device illustrated in FIG. 3 may be completed by forming a third protective layer PSV3 on the second protective layer PSV2.

The third protective layer PSV3 may be formed over the first to third pixels PXL1, PXL2, and PXL3. As an example, the third protective layer PSV3 may be formed on the second protective layer PSV2 of the first pixel PXL1. The third protective layer PSV3 may be formed on or directly formed on the second protective layer PSV2 of the first pixel PXL1, but the disclosure is not necessarily limited thereto. The third protective layer PSV3 may be formed on the second color filter CF2 of the second pixel PXL2. The third protective layer PSV3 may be formed on or directly formed on the second color filter CF2 of the second pixel PXL2, but the disclosure is not necessarily limited thereto. The third protective layer PSV3 may be formed on the second protective layer PSV2 of the third pixel PXL3. The third protective layer PSV3 may be formed on or directly formed on the second protective layer PSV2 of the third pixel PXL3, but the disclosure is not necessarily limited thereto.

The third protective layer PSV3 may be made of an inorganic material such as silicon oxide ($SiO_x$), silicon nitride ($SiN_x$), silicon oxynitride ($SiO_xN_y$), silicon oxycarbide ($SiO_xC_y$), aluminum oxide ($AlO_x$), aluminum nitride ($AlN_x$), zirconium oxide ($ZrO_x$), hafnium oxide ($HfO_x$), or titanium oxide ($TiO_x$), but the disclosure is not necessarily limited thereto.

Subsequently, the display device illustrated in FIG. 4 may be completed by forming a third color filter CF3 and a light blocking layer BM on the third protective layer PSV3.

The third color filter CF3 may be formed on or directly formed on the third protective layer PSV3 of the third pixel PXL3. The third color filter CF3 may overlap the light-emitting element LD and the organic layer OL of the third pixel PXL3 in the third direction (Z-axis direction). The third color filter CF3 may include a color filter material that selectively transmits light having a third color (or blue). For example, in case that the third pixel PXL3 is a blue pixel, the third color filter CF3 may include a blue color filter material.

According to embodiments, the light blocking layer BM may be further formed on the third protective layer PSV3. The light blocking layers BM may be disposed at boundaries between the first pixel PXL1, the second pixel PXL2, and the third pixel PXL3. For example, the light blocking layers BM may be provided on the bank patterns BNP and overlap the bank patterns BNP in the third direction (Z-axis direction). As described above, in case that the light blocking layers BM are formed at the boundaries between the first pixel PXL1, the second pixel PXL2, and the third pixel PXL3, color mixing defects visible from the front or side of a display device may be more effectively improved. The material of the light blocking layer BM is not particularly limited and may include various light blocking materials.

According to the above-described embodiment, in a state in which adjacent pixels PXL are masked or protected with a protective layer PSV, only the protective layer PSV of the corresponding pixel PXL may be partially opened to selectively inject the color conversion layer CCL into the corresponding pixel PXL. For example, the color conversion layer CCL can be applied on an entire surface of the display panel PNL without separate alignment, thereby improving processability.

Hereinafter, other embodiments will be described. In the following embodiments, the same components as the above-described components will be denoted by the same reference numerals, and repetitive descriptions thereof may be omitted or simplified.

Figure 21:
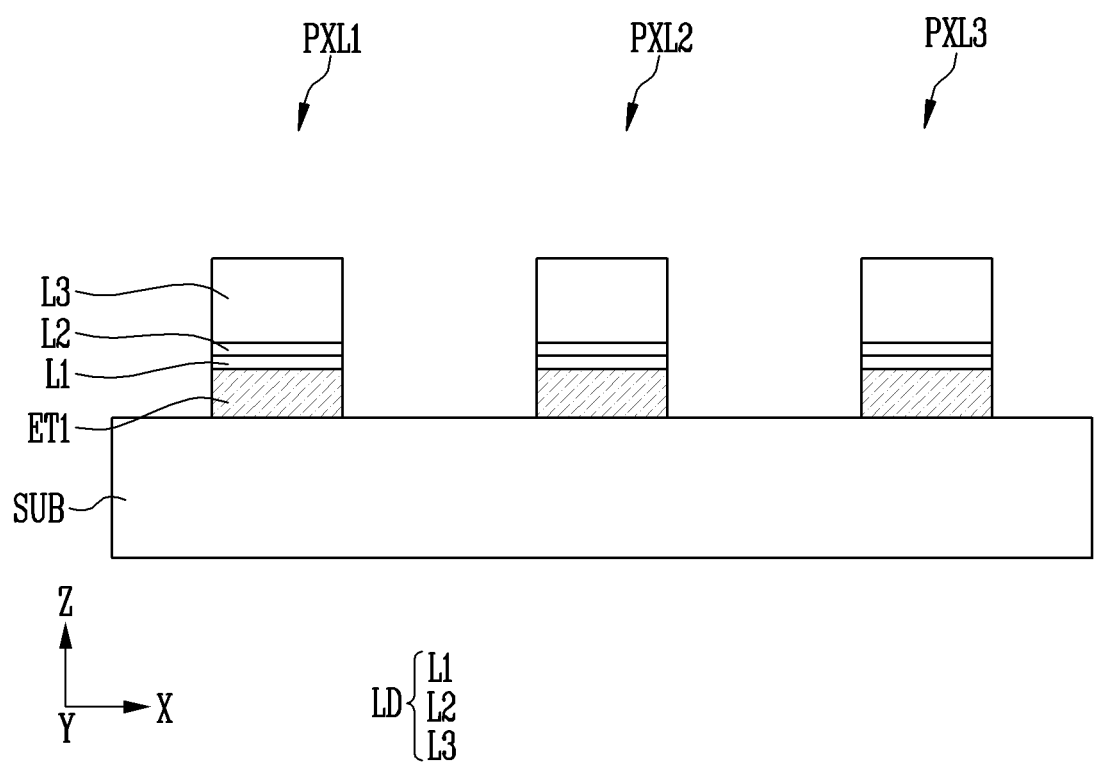
FIGS. 21 to 23 are schematic cross-sectional views illustrating processes of a method of manufacturing a display device according to an embodiment.
Figure 22:
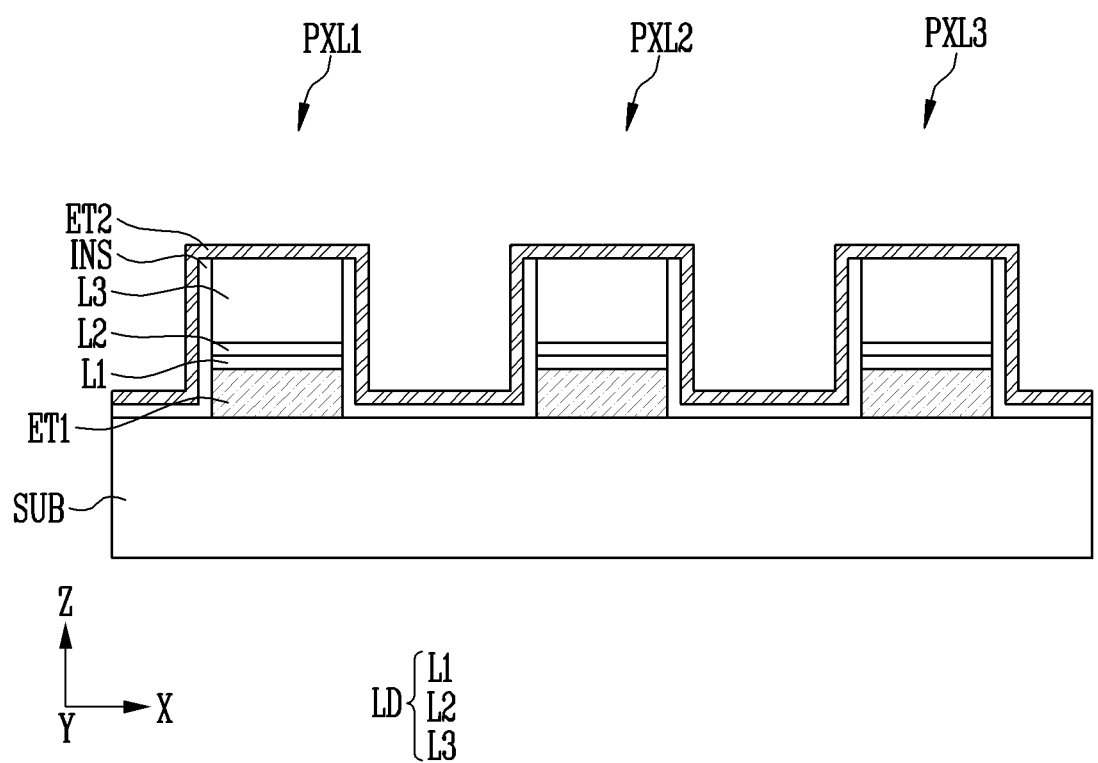
Figure 23:
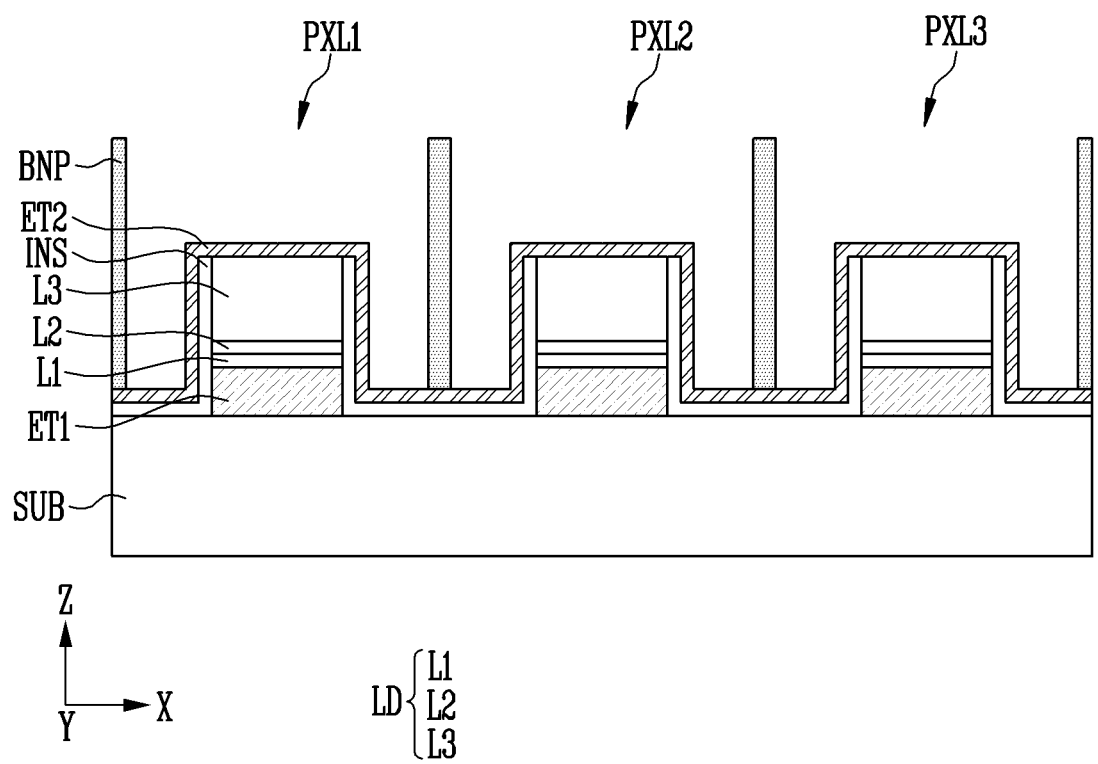

FIGS. 21 to 23 are schematic cross-sectional views illustrating processes of a method of manufacturing a display device according to an embodiment. FIGS. 21 to 23 are schematic cross-sectional views for describing a method of manufacturing the display device of FIG. 5. Components substantially the same as those of FIG. 5 are denoted by the same reference numerals, and detailed reference numerals are omitted.

Referring to FIG. 21, light-emitting elements LD are provided in first to third pixels PXL1, PXL2, and PXL3 of a substrate SUB. The substrate SUB may be a driving substrate including circuit elements or the like such as transistors constituting a pixel circuit PXC (see FIG. 2) of each pixel PXL. The light-emitting elements LD may be provided in the form in which a first semiconductor layer L1, an active layer L2, and a second semiconductor layer L3 may be sequentially stacked each other on the substrate SUB in a third direction (Z-axis direction). First electrodes ET1 may be provided between the light-emitting elements LD and the substrate SUB. The light-emitting elements LD may be connected to or coupled to the substrate SUB through the first electrodes ET1.

Referring to FIG. 22, an insulating film INS and a second electrode ET2 are provided on the light-emitting elements LD. The insulating film INS may be formed on side surfaces of the light-emitting elements LD. The insulating film INS may prevent an electrical short circuit that may occur due to the active layer L2 of the light-emitting elements LD contacting conductive materials other than the first and second semiconductor layers L1 and L3. The insulating film INS may minimize surface defects of the light-emitting elements LD, thereby improving the lifespan and luminous efficiency of the light-emitting elements LD.

The insulating film INS may cover or overlap the side surfaces of the light-emitting elements LD and may be partially removed to expose upper surfaces of the light-emitting elements LD. As an example, the insulating film INS may cover or overlap the side surfaces of the light-emitting elements LD and may be partially removed to expose the second semiconductor layer L3 of the light-emitting elements LD.

The second electrode ET2 may be formed on the insulating film INS. The second electrode ET2 may be formed on or directly formed on the upper surfaces of the light-emitting elements LD exposed by the insulating film INS and may contact the second semiconductor layers L3 of the light-emitting elements LD. The second electrode ET2 may be formed over the first to third pixels PXL1, PXL2, and PXL3.

Referring to FIG. 23, bank patterns BNP are provided on the second electrode ET2. The bank patterns BNP may be formed at boundaries between the first pixel PXL1, the second pixel PXL2, and the third pixel PXL3 on the second electrode ET2. As an example, the bank patterns BNP may be formed between the light-emitting elements LD.

The bank patterns BNP may include at least one reflective material. The bank patterns BNP may reflect light emitted from the light-emitting elements LD to improve the luminous efficiency of a display panel PNL. The bank patterns BNP may include at least one light blocking material to prevent color mixing between adjacent pixels PXL. However, the disclosure is not necessarily limited thereto, and the material of the bank patterns BNP may be variously changed according to embodiments.

Organic layers OL are provided between the bank patterns BNP. Since a process of forming the organic layer OL, a color conversion layer CCL, and/or a color filter layer CFL has been described in detail with reference to FIGS. 11 to 20, overlapping details may be omitted.

Figure 24:
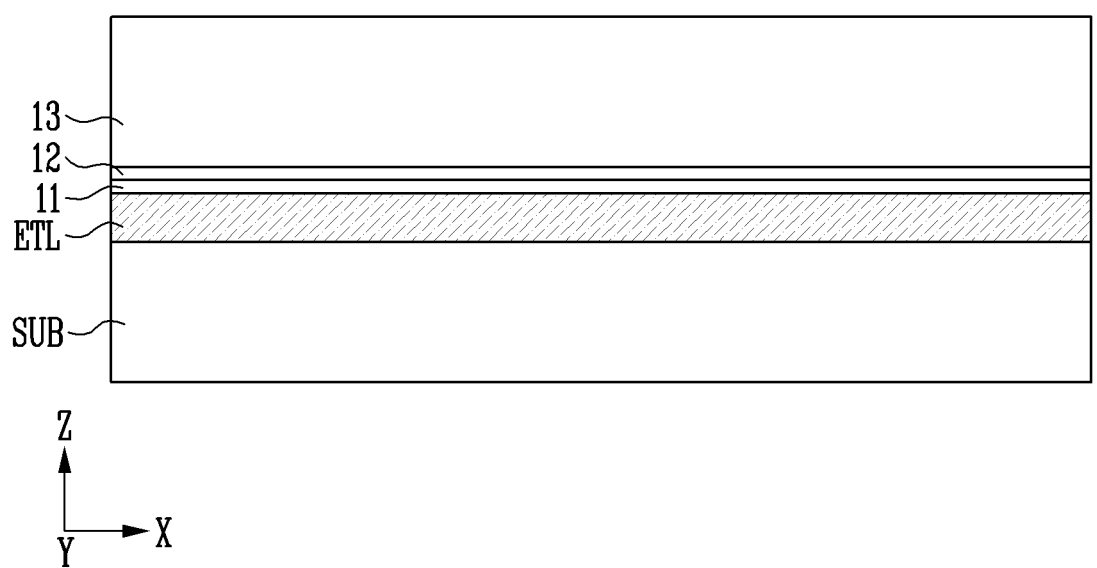
FIGS. 24 and 25 are schematic cross-sectional views illustrating processes of a method of manufacturing a display device according to an embodiment
Figure 25:
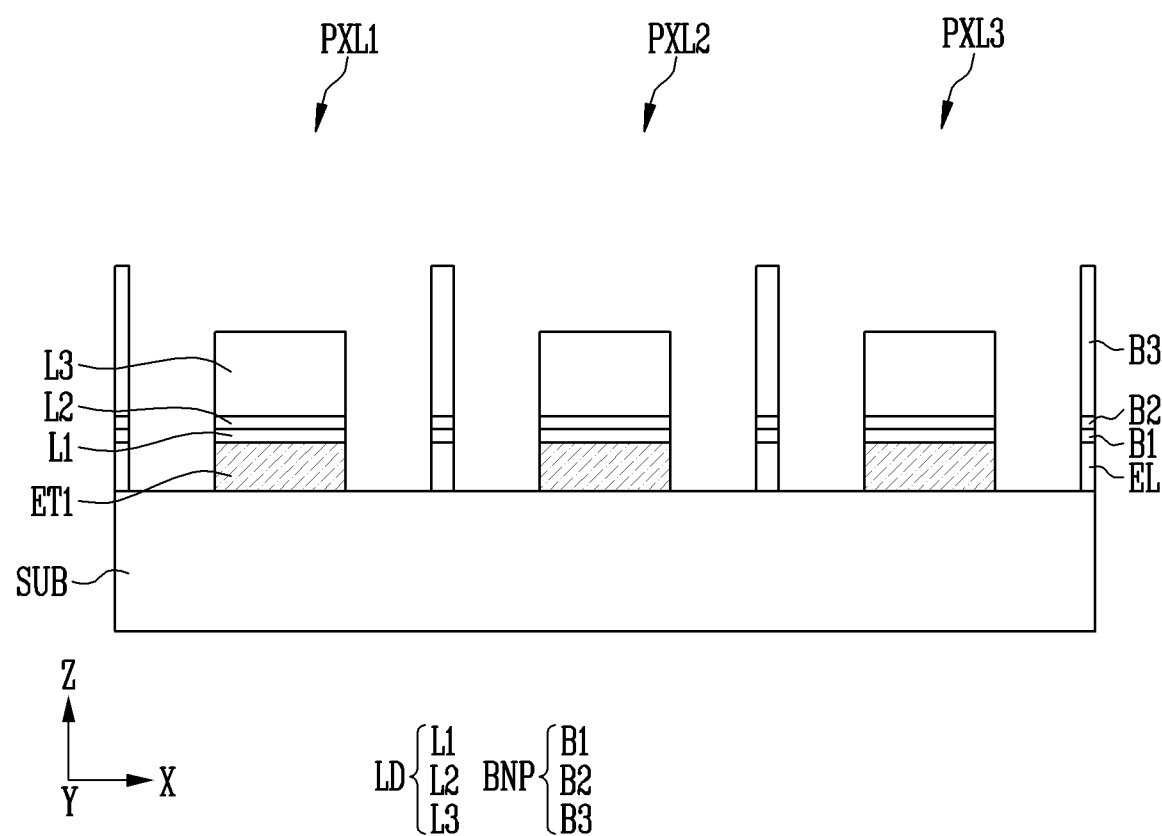

FIGS. 24 and 25 are schematic cross-sectional views of processes of a method of manufacturing a display device according to an embodiment. FIGS. 24 and 25 are schematic cross-sectional views for describing a method of manufacturing the display device of FIG. 6. Components substantially the same as those of FIG. 6 are denoted by the same reference numerals, and detailed reference numerals are omitted.

First, referring to FIG. 24, a substrate SUB is provided, and light-emitting stacks 11, 12, and 13 are provided on the substrate SUB. The light-emitting stacks 11, 12, and 13 may be formed by growing seed crystals through an epitaxial method. According to embodiments, the light-emitting stacks 11, 12, and 13 may be formed through metal organic chemical vapor deposition (MOCVD) method. However, the disclosure is not necessarily limited thereto, the light-emitting stacks 11, 12, and 13 may be formed through various methods such as an electron beam deposition method, a physical vapor deposition (PVD) method, a chemical vapor deposition (CVD) method, a plasma laser deposition (PLD) method, a dual-type thermal evaporation method, and a sputtering method.

The light-emitting stacks 11, 12, and 13 may include a first semiconductor layer 11, an active layer 12, and a second semiconductor layer 13 which are epitaxially grown. The first semiconductor layer 11, the active layer 12, and the second semiconductor layer 13 may be sequentially provided on the substrate SUB in a third direction (Z-axis direction). The first semiconductor layer 11 may include, for example, at least one p-type semiconductor layer. For example, the first semiconductor layer 11 may include a p-type semiconductor layer which may include at least one semiconductor material selected from GaN, InAlGaN, AlGaN, InGaN, AlN, and InN and may be doped with a first conductivity-type dopant (or a p-type dopant) including at least one selected from zinc (Zn), iron (Fe), magnesium (Mg), beryllium (Be), cadmium (Cd), silver (Ag), carbon (C), mercury (Hg), lithium (Li), and calcium (Ca). As an example, the first semiconductor layer 11 may include a GaN semiconductor material doped with the first conductivity-type dopant (or a p-type dopant), but the disclosure is not necessarily limited thereto. Various materials may constitute the first semiconductor layer 11.

The active layer 12 may have any one structure of a single well structure, a multi-well structure, a single quantum well structure, an MQW structure, a quantum dot structure, and a quantum line structure, but the disclosure is not necessarily limited thereto. The active layer 12 include GaN, InGaN, InAlGaN, AlGaN, or AlN. Various materials may constitute the active layer 12.

The second semiconductor layer 13 may be disposed on the active layer 12 and may include a semiconductor layer which is a different type from the first semiconductor layer 11. In one embodiment, the second semiconductor layer 13 may include at least one n-type semiconductor layer For example, the second semiconductor layer 13 may be an n-type semiconductor layer which may include any one semiconductor material selected from GaN, InAlGaN, AlGaN, InGaN, AlN, and InN and may be doped with a second conductivity-type dopant (or an n-type dopant) including at least one selected from silicon (Si), tin (Sn), tellurium (Te), selenium (Se), sulfur (S), oxygen (O), titanium (Ti), and germanium (Ge). As an example, the second semiconductor layer 13 may include a GaN semiconductor material doped with the second conductivity-type dopant (or an n-type dopant). However, a material constituting the second semiconductor layer 13 is not limited thereto, and the second semiconductor layer 13 may be made of various materials.

According to embodiments, a conductive layer ETL may be further formed between the substrate SUB and the first semiconductor layer 11. The conductive layer ETL may include a metal or a metal oxide. As an example, the conductive layer ETL may include one elected from copper (Cu), gold (Au), silver (Ag), chromium (Cr), titanium (Ti), aluminum (Al), nickel (Ni), indium (In), tin (Sn), and an oxide or an alloy thereof, but the disclosure is not necessarily limited thereto.

Referring to FIG. 25, the light-emitting stacks 11, 12, and 13 may be etched to form light-emitting elements LD and bank patterns BNP. The bank patterns BNP may be disposed at boundaries between a first pixel PXL1, a second pixel PXL2, and a third pixel PXL3. The light-emitting elements LD may be formed in the first to third pixels PXL1, PXL2, and PXL3 between the bank patterns BNP. As an example, in a process of etching the light-emitting stacks 11, 12, and 13, the light-emitting elements LD and the bank patterns BNP having different thicknesses may be simultaneously formed using a difference in etch selectivity of a mask.

According to embodiments, in the process of etching the light-emitting stacks 11, 12, and 13, The conductive layer ETL may be separated into a first electrode ET1 and an electrode layer EL. As an example, the conductive layer ETL may be separated into the first electrode ET1 under or below the light-emitting elements LD and the electrode layer EL under or below the bank patterns BNP.

An insulating film INS and a second electrode ET2 are provided on the light-emitting elements LD and/or the bank patterns BNP. Since a process of forming the second electrode ET2, an organic layer OL, a protective layer PSV, a color conversion layer CCL, and/or a color filter layer CFL has been described in detail with reference to FIGS. 10 to 20, overlapping details may be omitted.

FIGS. 26 to 30 are schematic cross-sectional views of processes of a method of manufacturing a display device according to an embodiment. FIGS. 26 to 30 are schematic cross-sectional views for describing a method of manufacturing the display device of FIG. 7. Components substantially the same as those of FIG. 7 are denoted by the same reference numerals, and detailed reference numerals are omitted.

Figure 26:
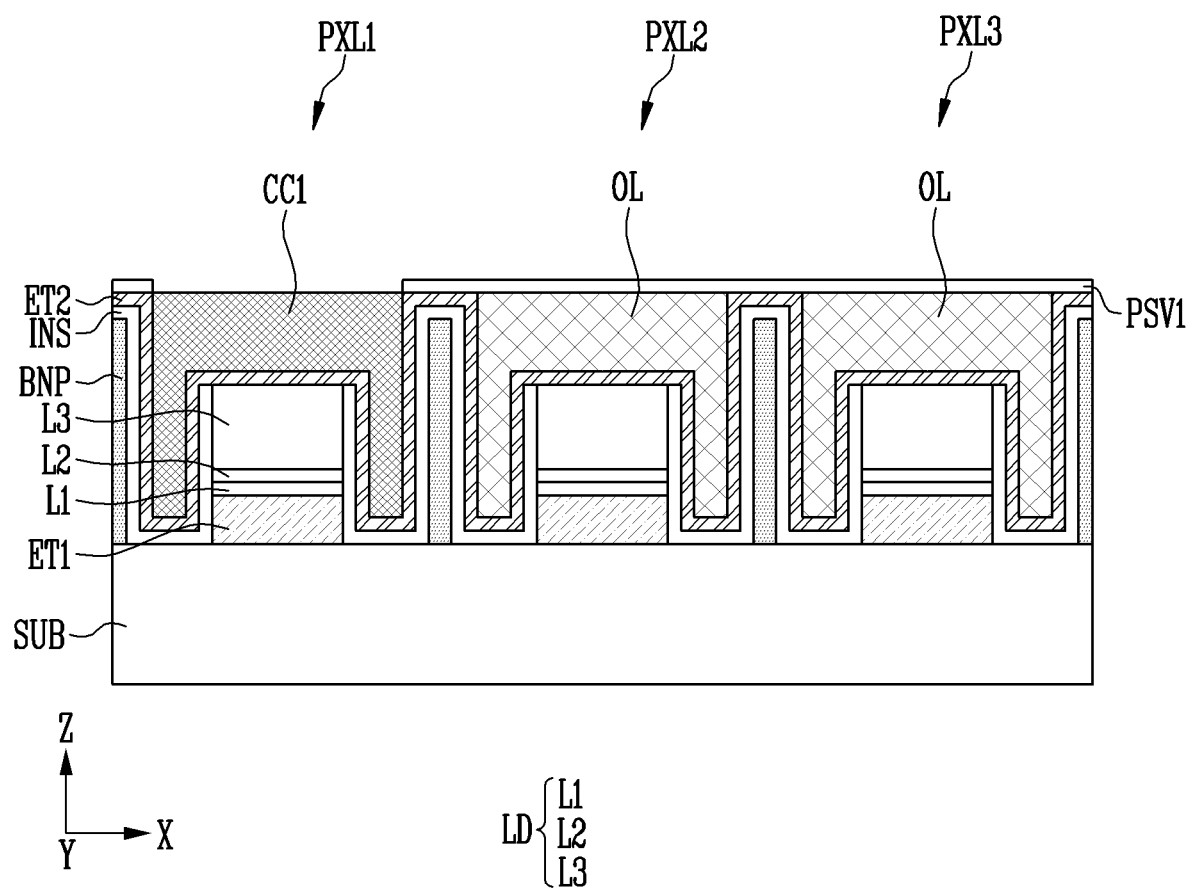
FIGS. 26 to 30 are schematic cross-sectional views illustrating processes of a method of manufacturing a display device according to an embodiment

First, referring to FIG. 26, a first color conversion layer CC1 is provided between bank patterns BNP of a first pixel PXL1 from which an organic layer OL and a first protective layer PSV1 are removed. The first color conversion layer CC1 may be selectively injected into the first pixel PXL1 through a first opening OP1 of the first protective layer PSV1. In a process of injecting the first color conversion layer CC1 into the opened first pixel PXL1, the first protective layer PSV1 may cover or overlap and protect remaining pixels PXL. As an example, in the process of injecting the first color conversion layer CC1 into the first pixel PXL1, the first protective layer PSV1 may serve to protect organic layers OL of a second pixel PXL2 and a third pixel PXL3. Accordingly, since the first color conversion layer CC1 may be selectively injected into the first pixel PXL1 in a state in which adjacent pixels PXL are masked or protected, processability can be improved as described above. Since an operation of removing the organic layer OL and the first protective layer PSV1 of the first pixel PXL1 has been described in detail with reference to FIGS. 8 to 13, overlapping details may be omitted.

Figure 27:
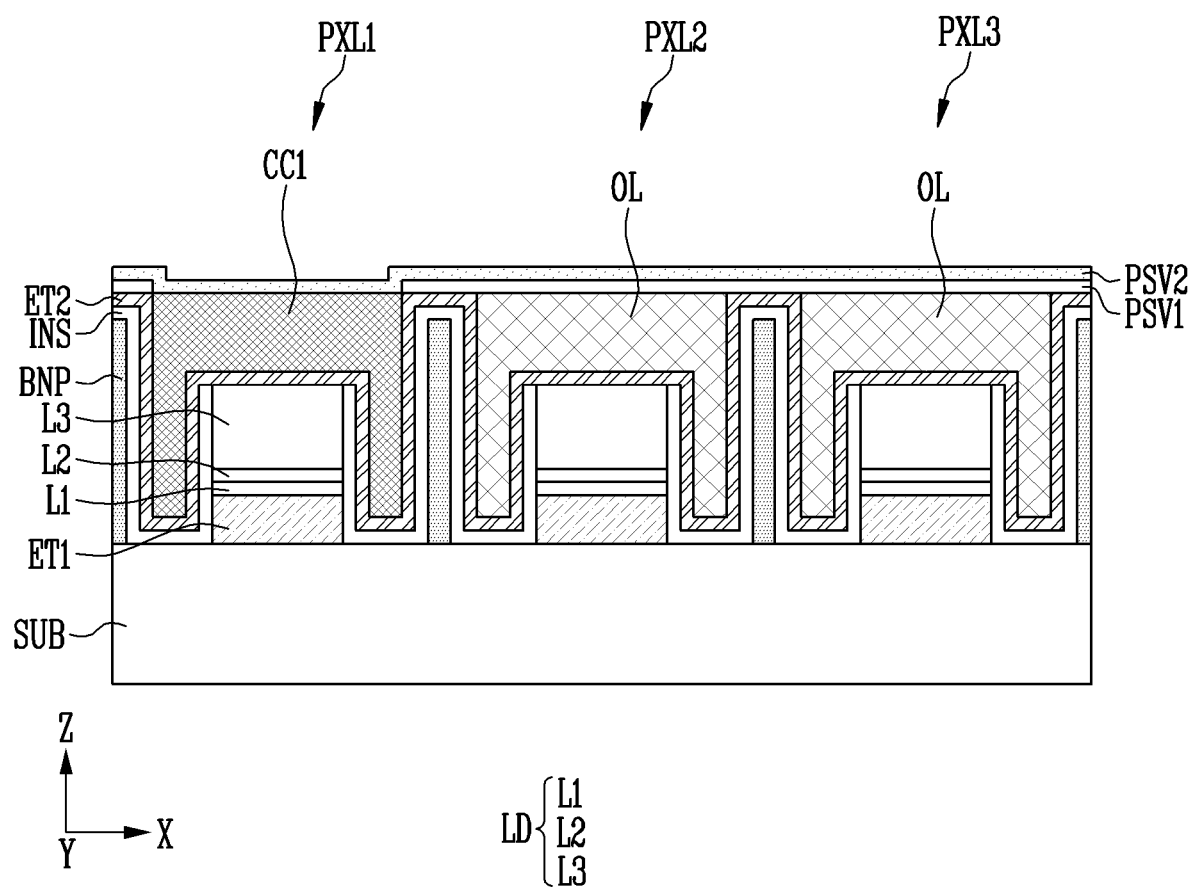

Referring to FIG. 27, a second protective layer PSV2 is provided. The second protective layer PSV2 may be formed over the first to third pixels PXL1, PXL2, and PXL3. As an example, the second protective layer PSV2 may be formed on the first color conversion layer CC1 of the first pixel PXL1. The second protective layer PSV2 may be formed on or directly formed on the first color conversion layer CC1 of the first pixel PXL1, but the disclosure is not necessarily limited thereto. The second protective layer PSV2 may be formed on the first protective layer PSV1 of the second pixel PXL2. The second protective layer PSV2 may be formed on or directly formed on the first protective layer PSV1 of the second pixel PXL2, but the disclosure is not necessarily limited thereto. The second protective layer PSV2 may be disposed on the first protective layer PSV1 of the third pixel PXL3. The second protective layer PSV2 may be formed on or directly formed on the first protective layer PSV1 of the third pixel PXL3, but the disclosure is not necessarily limited thereto.

Figure 28:
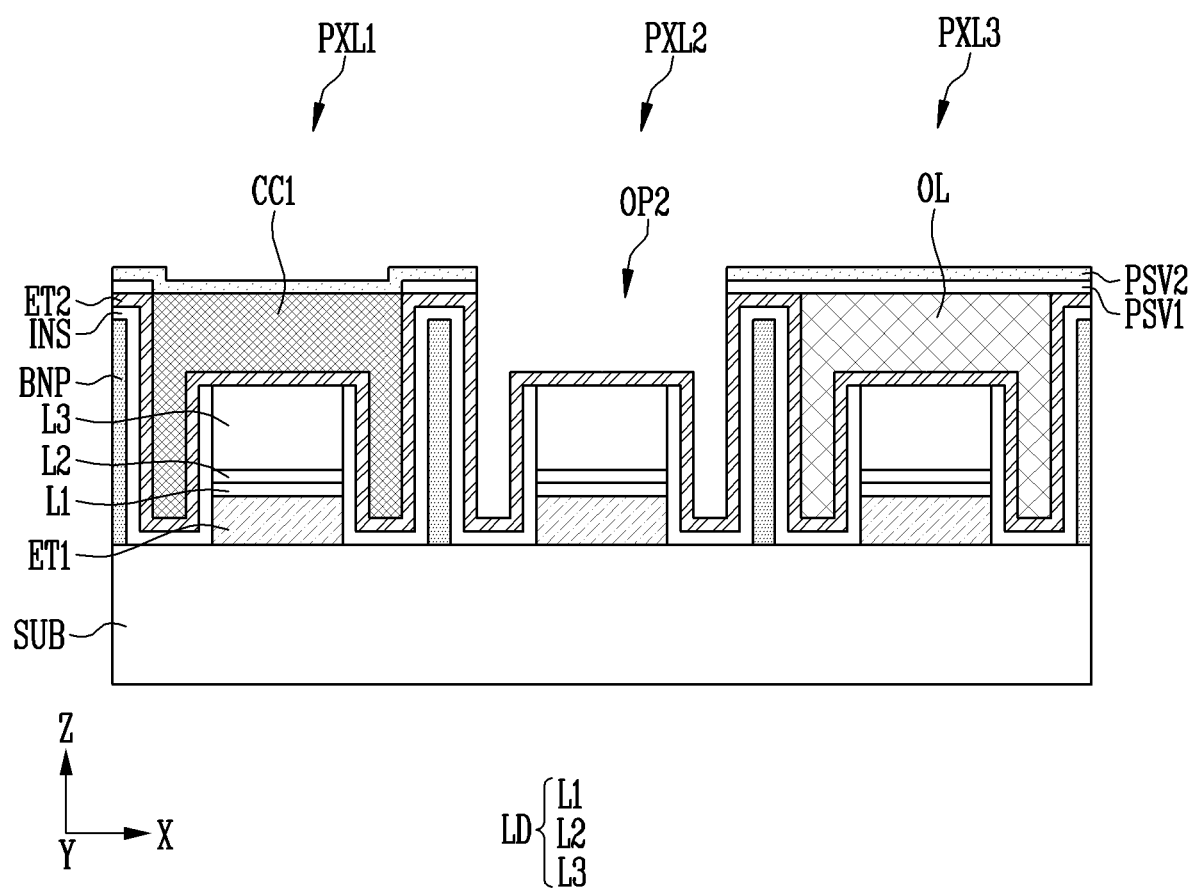

Referring to FIG. 28, the organic layer OL, the first protective layer PSV1, and the second protective layer PSV2 of the second pixel PXL2 are removed. As an example, the first protective layer PSV1 and the second protective layer PSV2 may be partially removed to form a second opening OP2 exposing the second pixel PXL2, and the organic layer OL of the second pixel PXL2 may be removed through the second opening OP2.

In a process of removing the organic layer OL, the first protective layer PSV1, and the second protective layer PSV2 of the second pixel PXL2, the first pixel PXL1 and the third pixel PXL3 may be covered or overlapped by the second protective layer PSV2. For example, the second opening OP2 exposing the second pixel PXL2 may be formed in a state in which adjacent pixels PXL are masked or protected with the second protective layer PSV2.

Figure 29:
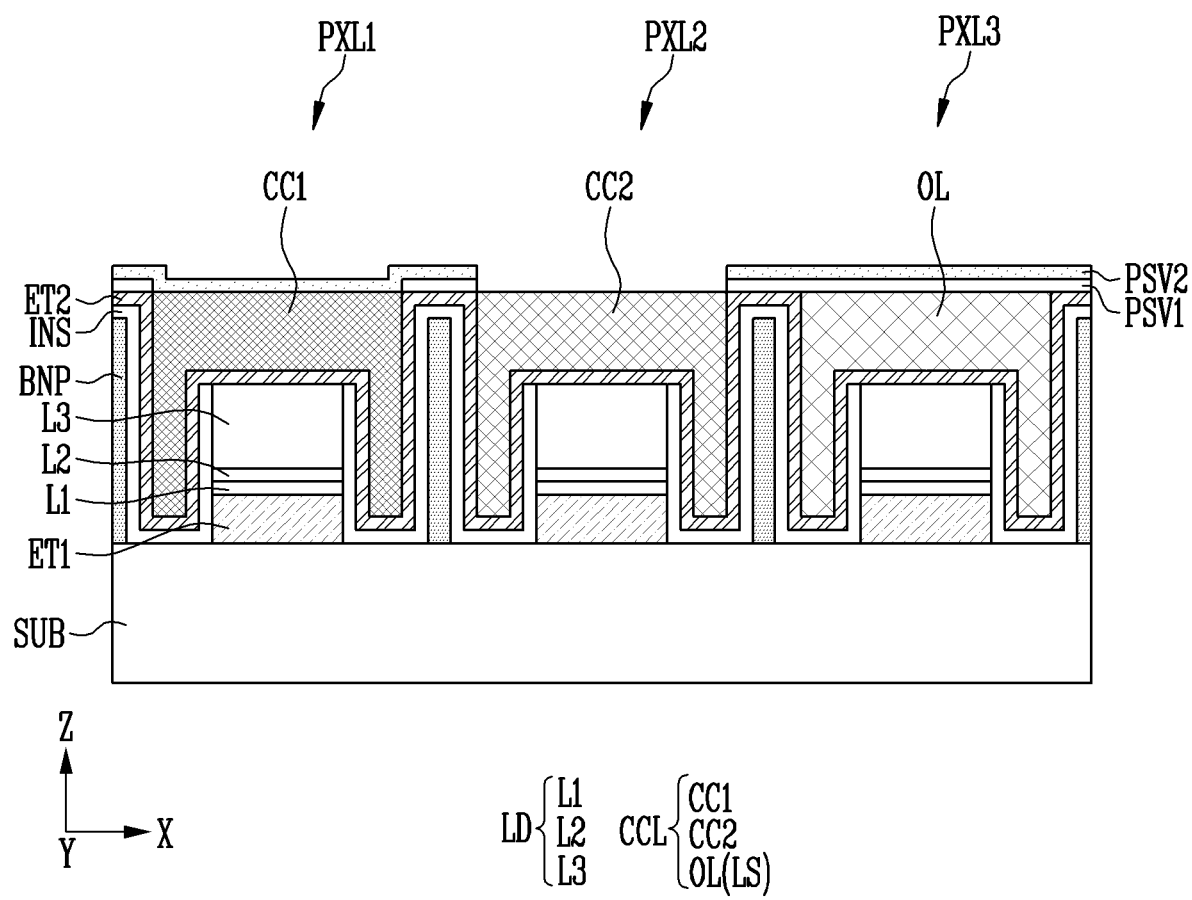

Referring to FIG. 29, a second color conversion layer CC2 is provided between the bank patterns BNP of the second pixel PXL2 from which the organic layer OL, the first protective layer PSV1, and the second protective layer PSV2 are removed. The second color conversion layer CC2 may be selectively injected into the second pixel PXL2 through the second opening OP2 of the second protective layer PSV2. In a process of injecting the second color conversion layer CC2 into the exposed second pixel PXL2, the second protective layer PSV2 may serve to cover or overlap and protect the remaining pixels PXL. As an example, in the process of injecting the second color conversion layer CC2 into the second pixel PXL2, the second protective layer PSV2 may serve to protect the first pixel PXL1 and the third pixel PXL3. Accordingly, since the second color conversion layer CC2 may be selectively injected into the second pixel PXL2 in a state in which adjacent pixels PXL are masked or protected, processability can be improved as described above.

Figure 30:
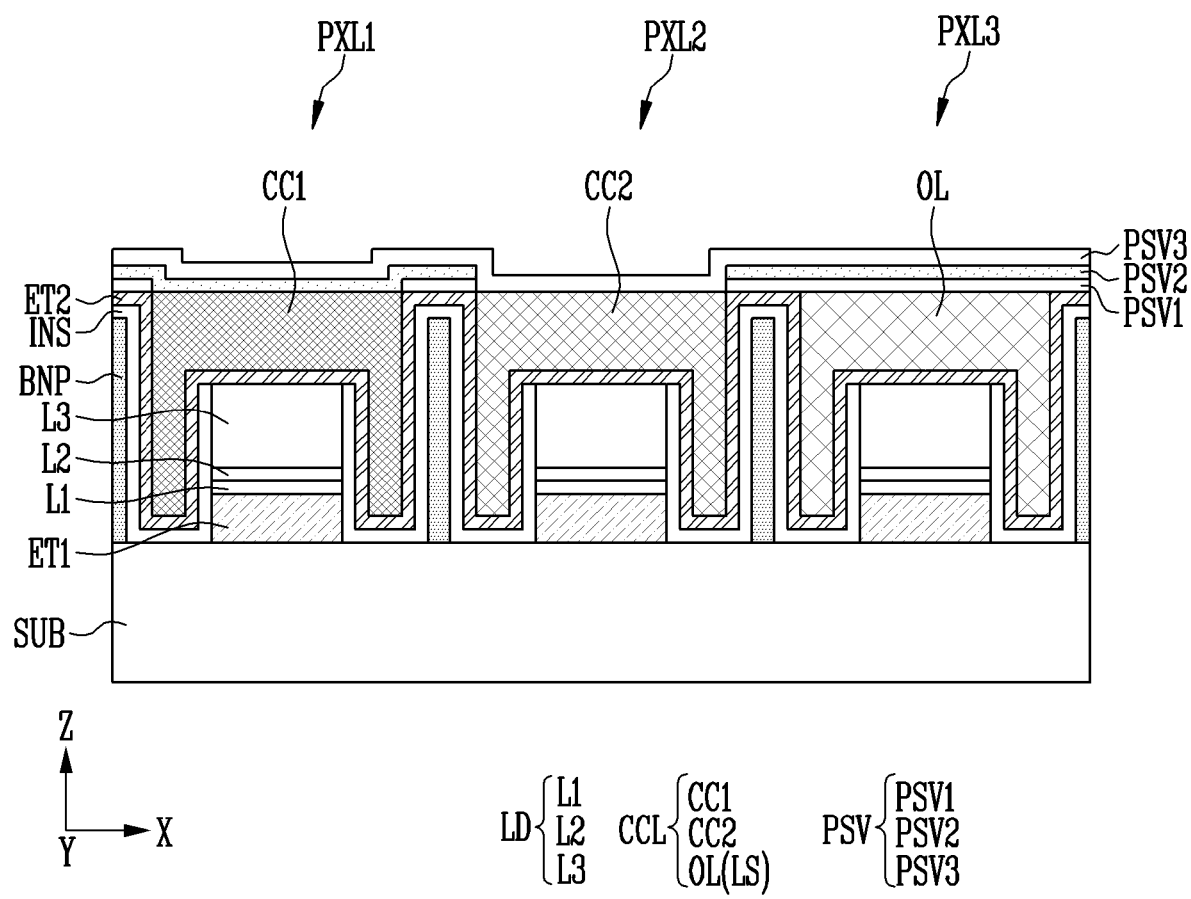

Referring to FIG. 30, a third protective layer PSV3 is formed on the second protective layer PSV2. The third protective layer PSV3 may be formed over the first to third pixels PXL1, PXL2, and PXL3. As an example, the third protective layer PSV3 may be formed on the second protective layer PSV2 of the first pixel PXL1. The third protective layer PSV3 may be formed on or directly formed on the second protective layer PSV2 of the first pixel PXL1, but the disclosure is not necessarily limited thereto. The third protective layer PSV3 may be formed on the second color conversion layer CC2 of the second pixel PXL2. The third protective layer PSV3 may be formed on or directly formed on the second color conversion layer CC2 of the second pixel PXL2, but the disclosure is not necessarily limited thereto. The third protective layer PSV3 may be formed on the second protective layer PSV2 of the third pixel PXL3. The third protective layer PSV3 may be formed on or directly formed on the second protective layer PSV2 of the third pixel PXL3, but the disclosure is not necessarily limited thereto.

Subsequently, the display device illustrated in FIG. 7 may be completed by forming a color filter layer CFL and a light blocking layer BM on the third protective layer PSV3. Since a process of forming the color filter layer CFL and/or the light blocking layer BM has been described in detail with reference to FIGS. 15 to 20, overlapping details may be omitted.

Hereinafter, an electronic device to which the display device of the above-described embodiments applicable will be described.

FIGS. 31 to 34 are views illustrating electronic devices according to embodiments.

Figure 31:
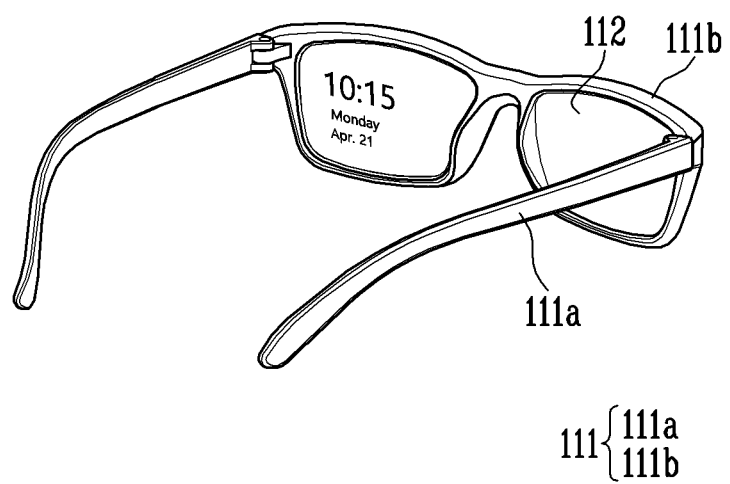
FIGS. 31 to 34 are views illustrating electronic devices according to embodiments.

Referring to FIG. 31, the display device according to the above-described embodiments may be applied to smart glasses. The smart glasses may include a frame 111 and a lens part 112. The smart glasses may be a wearable electronic device that can be worn on a user's face and may have a structure in which a portion of the frame 111 is folded or unfolded. For example, the smart glasses may be a wearable device for augmented reality (AR).

The frame 111 may include a housing 111b supporting the lens part 112 and a leg part 111a for wearing by a user. The leg part 111a may be connected to the housing 111b through a hinge and may be folded or unfolded.

A battery, a touch pad, a microphone, and/or a camera may be embedded in the frame 111. A projector for outputting light and/or a processor for controlling an optical signal may be embedded in the frame 111.

The lens part 112 may be an optical member that transmits light or reflects light. The lens part 112 may include glass and/or a transparent synthetic resin.

The display device according to the above-described embodiments may be applied to the lens part 112. As an example, the user may recognize an image displayed by the optical signal transmitted from the projector of the frame 111 through the lens part 112. For example, the user may recognize information such as time and date displayed on the lens part 112.

Figure 32:
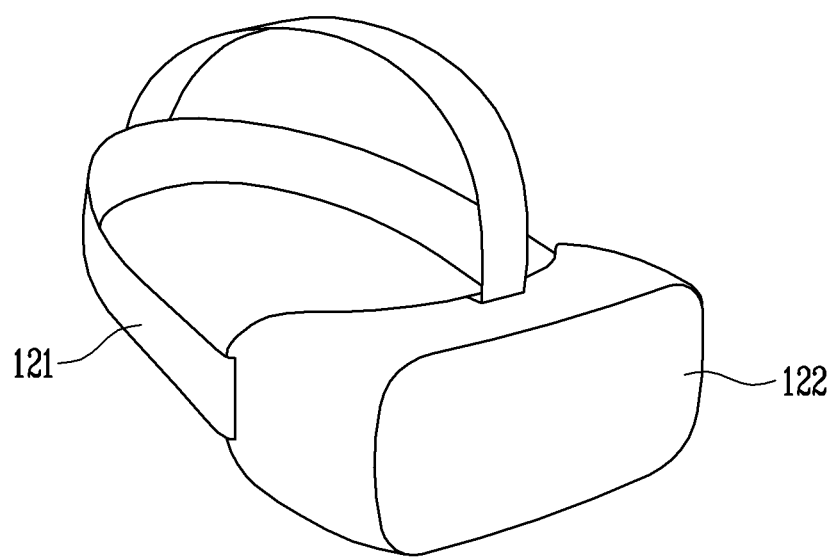

Referring to FIG. 32, the display device according to the above-described embodiments may be applied to a head mounted display (HMD). The HMD may include a head mounted band 121 and a display accommodation case 122. For example, the HMD may be a wearable electronic device that may be wearable on a user's head.

The head mounted band 121 may be connected to the display accommodation case 122 to fix the display accommodation case 122. As shown in FIG. 32, the head mounted band 121 may include a horizontal band and a vertical band which are for fixing the head mounted display to the user's head, and the horizontal band may be provided to surround a side portion of the user's head, and the vertical band may be provided to surround an upper portion of the user's head. However, the disclosure is not necessarily limited thereto, and the head mounted band 121 may be implemented in the form of an eyeglass frame or a helmet.

The display accommodation case 122 may accommodate a display device and may include at least one lens. At least one lens may provide an image to a user. For example, the display device according to the above-described embodiments may be applied to a left eye lens and a right eye lens implemented in the display accommodation case 122.

Figure 33:
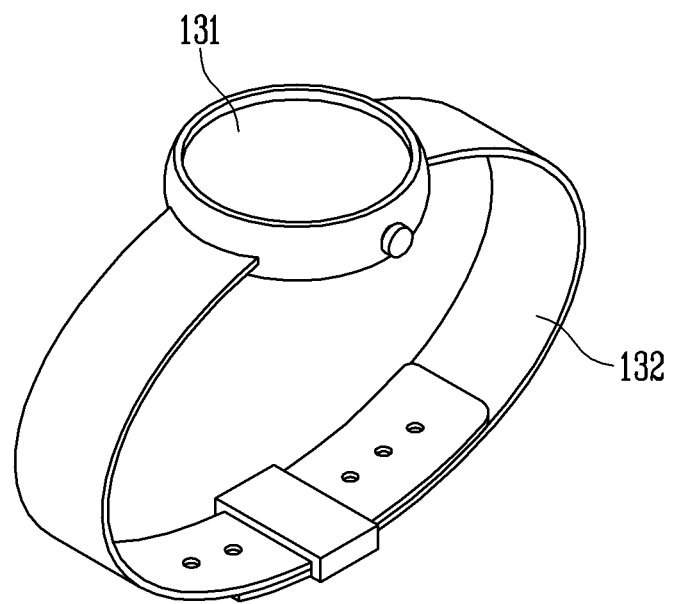

Referring to FIG. 33, the display device according to the above-described embodiments may be applied to a smart watch. The smart watch may include a display unit 131 and a strap part 132. The smart watch may be a wearable electronic device, and the strap part 132 may be mounted on a user's wrist. The display device according to the above-described embodiments may be applied to the display unit 131. For example, the display unit 131 may provide image data including information such as time and date.

Figure 34:
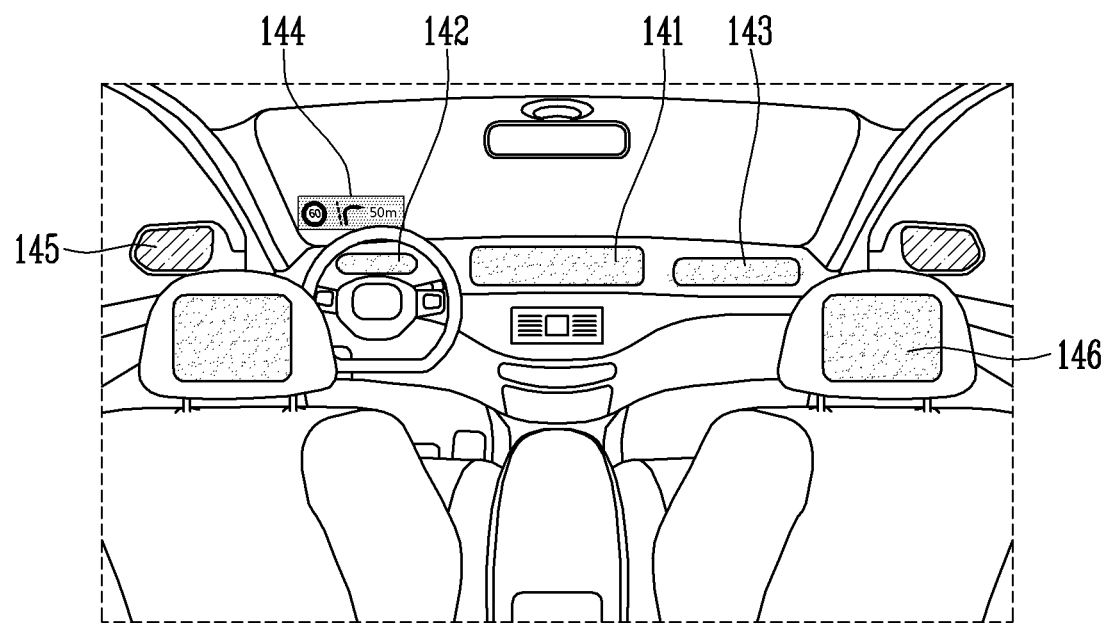

Referring to FIG. 34, the display device according to the above-described embodiments may be applied to an automotive display. For example, the automotive display may refer to an electronic device provided inside and outside a vehicle to provide image data.

For example, the display device according to the above-described embodiments may be applied to at least one of an infotainment panel 141, a cluster 142, a co-driver display 143, a head-up display 144, a side mirror display 145, and a rear seat display 146.

It will be apparent to those skilled in the art to which the embodiments pertain that a variety of modifications are possible without departing from the characteristics of the disclosure. Therefore, the above-described methods shall be interpreted as being illustrative while not being limiting. The scope of the disclosure is defined by the appended claims and the foregoing description, and all differences within the scope and/or equivalents thereof should be construed as being included in the disclosure.

According to embodiments, a color conversion layer may be selectively injected by partially opening only a corresponding pixel in a state in which adjacent pixels are masked or protected with a protective layer, thereby improving processability.

Effects of the disclosure are not limited to the embodiments set forth herein and further effects are included in the specification.

What is claimed is:

1. A display device comprising:
a first pixel;
a second pixel;
a third pixel;
bank patterns disposed on a substrate;
light-emitting elements disposed between the bank patterns;
color conversion layers disposed on the light-emitting elements between the bank patterns;
protective layers disposed on the color conversion layers; and
a first color filter disposed in the first pixel,
wherein the protective layers in the first pixel, the second pixel, and the third pixel have different thicknesses,
wherein the protective layers include a first protective layer on the color conversion layers and a second protective layer on the first protective layer, and
wherein the first color filter is disposed between the first protective layer and the second protective layer.

2. The display device of claim 1, wherein a thickness of the protective layers in the third pixel is greater than at least one of a thickness of the protective layers in the first pixel and a thickness of the protective layers in the second pixel.

3. The display device of claim 2, wherein the thickness of the protective layers in the first pixel is greater than the thickness of the protective layers in the second pixel.

4. The display device of claim 1, wherein the first protective layer is disposed in the third pixel and includes openings exposing the first pixel and the second pixel.

5. The display device of claim 1, wherein the second protective layer is disposed in the first pixel and the third pixel and includes an opening exposing the second pixel.

6. The display device of claim 1,
wherein the first color filter is disposed between the color conversion layers and the second protective layer.

7. The display device of claim 1, wherein the protective layers further include a third protective layer disposed in the first pixel, the second pixel, and the third pixel.

8. The display device of claim 1, further comprising:
a second color filter disposed in the second pixel,
wherein the second color filter is disposed between the color conversion layers and the third protective layer.

9. The display device of claim 8, wherein
the first pixel is a first color pixel,
the second pixel is a second color pixel,
the third pixel is a third color pixel, and
the light-emitting elements emit a third color.

10. The display device claim 9, wherein the color conversion layers includes:
a first color conversion layer disposed in the first pixel;
a second color conversion layer disposed in the second pixel; and
a scattering layer disposed in the third pixel.

* * * * *